(12) United States Patent
Mar

(10) Patent No.: US 6,941,336 B1
(45) Date of Patent: Sep. 6, 2005

(54) PROGRAMMABLE ANALOG SYSTEM ARCHITECTURE

(75) Inventor: Monte Mar, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 547 days.

(21) Appl. No.: 09/909,047

(22) Filed: Jul. 18, 2001

Related U.S. Application Data
(60) Provisional application No. 60/243,708, filed on Oct. 26, 2000.

(51) Int. Cl.[7] .................................................. G06G 7/00
(52) U.S. Cl. .......................................... 708/801; 708/3
(58) Field of Search ..................................... 708/3, 801

(56) References Cited

U.S. PATENT DOCUMENTS

| | | | |
|---|---|---|---|
| 5,202,687 A | 4/1993 | Distinti | 341/158 |
| 5,245,262 A | 9/1993 | Moody et al. | 318/560 |
| 5,493,246 A * | 2/1996 | Anderson | 327/382 |
| 5,574,678 A * | 11/1996 | Gorecki | 708/801 |
| 5,677,691 A | 10/1997 | Hosticka et al. | 341/155 |
| 5,691,664 A | 11/1997 | Anderson et al. | 327/565 |
| 6,003,054 A * | 12/1999 | Oshima et al. | 708/230 |
| 6,144,327 A | 11/2000 | Distinti et al. | 341/126 |
| 6,311,149 B1 * | 10/2001 | Ryan et al. | 703/21 |
| 6,590,517 B1 * | 7/2003 | Swanson | 341/155 |
| 6,614,260 B1 * | 9/2003 | Welch et al. | 326/41 |

FOREIGN PATENT DOCUMENTS

| WO | WO 95/32478 | 11/1975 | G06F/17/50 |
|---|---|---|---|

OTHER PUBLICATIONS

"Programming Methodology and Architecture for a Programmable Analog System (As Amended)"; Aug. 14, 2001; U.S. Appl. No. 09/930,021; Mar et al.
"Programmable System on a Chip"; Oct. 1, 2001; U.S. Appl. No. 10/033,027; W. Snyder.

* cited by examiner

*Primary Examiner*—Tan V. Mai
(74) *Attorney, Agent, or Firm*—Wagner, Murabito & Hao LLP

(57) ABSTRACT

A programmable analog system architecture and method thereof are described. The analog system architecture and method introduce a single chip solution that contains a set of tailored analog blocks and elements that can be configured and reconfigured in different ways to implement a variety of different analog functions. The architecture includes an array of analog blocks, including continuous time blocks and different types of switched capacitor blocks. The analog blocks can be electrically coupled to each other in different combinations to perform different analog functions. Each analog block includes analog elements that have changeable characteristics that can be specified according to the function to be performed. The architecture thereby facilitates the design of customized chips at less time and expense.

22 Claims, 23 Drawing Sheets

PROGRAMMABLE ANALOG SYSTEM ARCHITECTURE

RELATED U.S. APPLICATION

This application claims priority to the provisional patent application, Ser. No. 60/243,708, entitled "Advanced Programmable Microcontroller Device," with filing date Oct. 26, 2000, and assigned to the assignee of the present application.

TECHNICAL FIELD

The present invention generally relates to the field of microcontrollers. More specifically, the present invention pertains to a mixed signal system-on-a-chip architecture that can be dynamically configured to perform a variety of analog functions.

BACKGROUND ART

Microcontrollers function to replace mechanical and electromechanical components in a variety of applications and devices. Microcontrollers have evolved since they were first introduced approximately 30 years ago, to the point where they can be used for increasingly complex applications. Some microcontrollers in use today are also programmable, expanding the number of applications in which they can be used.

However, even though there are a large number of different types of microcontrollers available on the market with a seemingly wide range of applicability, it is still often difficult for a designer to find a microcontroller that is particularly suited for a particular application. Unique aspects of the intended application may make it difficult to find an optimum microcontroller, perhaps necessitating a compromise between the convenience of using an existing microcontroller design and less than optimum performance.

In those cases in which a suitable microcontroller is found, subsequent changes to the application and new requirements placed on the application will likely effect the choice of microcontroller. The designer thus again faces the challenge of finding a suitable microcontroller for the intended application.

One solution to the problems described above is to design (or have designed) a microcontroller customized for the intended application. However, this solution may still not be practical because of the time needed to develop a custom microcontroller and the cost of doing so. In addition, should the design of the intended application be changed, it may also be necessary to change the design of the custom microcontroller, further increasing costs and lead times. Moreover, the option of designing a custom microcontroller is generally only available to very large volume customers.

Application specific integrated circuits (ASICs) may suggest a solution to he problem of finding a suitable microcontroller for an application. However, ASICs can also be problematic because they require a sophisticated level of design expertise, and the obstacles of long development times, high costs, and large volume requirements still remain. Solutions such as gate arrays and programmable logic devices provide flexibility, but they too are expensive and require a sophisticated level of design expertise.

Accordingly, what is needed is a system and/or method that can allow microcontrollers to be developed for a variety of possible applications without incurring the development expenses and delays associated with contemporary microcontrollers. The present invention provides a novel solution to these needs.

DISCLOSURE OF THE INVENTION

The present invention provides a programmable analog system architecture that is suited for a variety of applications and that can reduce development time and expenses. The programmable analog system architecture is integrated with a microcontroller that provides sequencing and programming instructions. The present invention introduces a single chip solution that contains a set of tailored analog blocks and elements that can be dynamically configured and reconfigured in different ways to implement a variety of different analog functions.

The analog system architecture can be generally referred to as a programmable analog "system-on-a-chip" block. Such programmable blocks can be used in those applications that typically require multiple chips that may be fabricated using different technologies. Implementation in embedded applications, including audio, wireless, handheld, data communications, Internet control, and industrial and consumer systems, is contemplated.

In the present embodiment, the analog blocks are arranged on a single integrated circuit, or chip. The analog blocks can be electrically coupled in different combinations to perform different analog functions. Each analog block can also be configured according to the function to be performed. In the present embodiment, the analog blocks include analog elements that have changeable characteristics that can be specified according to the function to be performed. Inputs received by an analog block are directed through the analog block according to the specified characteristics of the analog elements. The combination of analog blocks and the characteristics of the analog elements, and hence the analog function to be performed, can be dynamically programmed.

In one embodiment, the analog blocks include switched analog blocks that can be electrically coupled to and decoupled from one or more other analog blocks. That is, latches and switches can be dynamically configured so that signals can be passed from one block to another, while other blocks are bypassed. Accordingly, a set of analog blocks can be selectively combined to implement a particular analog function. Other analog functions can be implemented by selectively combining a different set of analog blocks.

In one embodiment, the switched analog blocks are switched capacitor blocks. In another embodiment, two different types of switched capacitor blocks are used; the two types are distinguishable according to the type and number of inputs they receive and how those inputs are treated.

In yet another embodiment, the analog blocks also include continuous time blocks.

In one embodiment, the continuous time blocks and the switched capacitor blocks are arranged in rows and columns in an array. In one such embodiment, the array includes a first row of continuous time blocks and multiple rows of switched capacitor blocks, where the first row of continuous time blocks is disposed between the switched capacitor blocks and an edge of the array. In one embodiment, the analog blocks in a column are each coupled to a respective digital bus (that is, there is a digital bus for each column of analog blocks).

The analog functions that can be performed using the system architecture and method of the present invention include (but are not limited to) an amplifier function, a digital-to-analog converter function, an analog-to-digital converter function, an analog driver function, a low band pass filter function, and a high band pass filter function.

In summary, the present invention provides a programmable, multi-functional analog system and method that comprise a number of analog blocks comprising a number of analog elements that have been selected to perform a large number of different analog functions and applications. In one embodiment, the present invention uses latches and switches to selectively and electrically couple analog blocks in different combinations depending on the function to be performed. The characteristics of the analog elements in an analog block can also be specified according to the function to be performed.

These and other objects and advantages of the present invention will become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
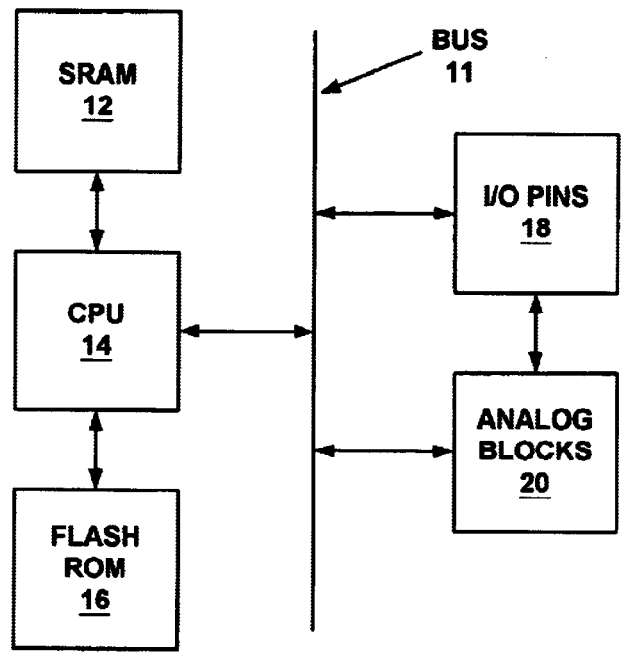
FIG. 1 is a block diagram showing an exemplary integrated circuit (or microcontroller) upon which embodiments of the present invention may be implemented.

FIG. 1 is a block diagram showing an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and analog blocks 20. The analog blocks 20 are further described below. A test interface (not shown) may be coupled to integrated circuit 10 to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely.

Analog blocks 20 are configurable system resources that can reduce the need for other microcontroller parts and external components. In the present embodiment, analog blocks 20 include an array of twelve blocks. A precision internal voltage reference provides accurate analog comparisons. A temperature sensor input is provided to the array of analog blocks to support applications like battery chargers and data acquisition without requiring external components.

In the present embodiment, there are three types of analog blocks: continuous time blocks, and two types of switched capacitor blocks (referred to herein as type A and type B). Continuous time blocks provide continuous time analog functions. Continuous time blocks are described in further detail in conjunction with FIG. 4A.

Switched capacitor blocks provide discrete time analog functions such as analog-to-digital conversion (ADC) and digital-to-analog conversion (DAC) functions. The key difference between the type A and type B switched capacitor blocks is in generating biquad filters (see FIGS. 14A and 14B below). Both type A and type B blocks can implement basic switched capacitor functions (outside of filters), and the type A block can also function as a summing amplifier. Switched capacitor blocks are described in further detail in conjunction with FIGS. 9A and 10A, below.

Analog functions supported by integrated circuit 10 comprising analog blocks 20 include, but are not limited to: 14-bit multi-slope and 12-bit delta-sigma ADC, successive approximation ADCs up to nine bits, DACs up to nine bits, programmable gain stages, sample and hold circuits, filters (high band pass and low band pass) with programmable coefficients, amplifiers, differential comparators, and temperature sensors.

Figure 2:
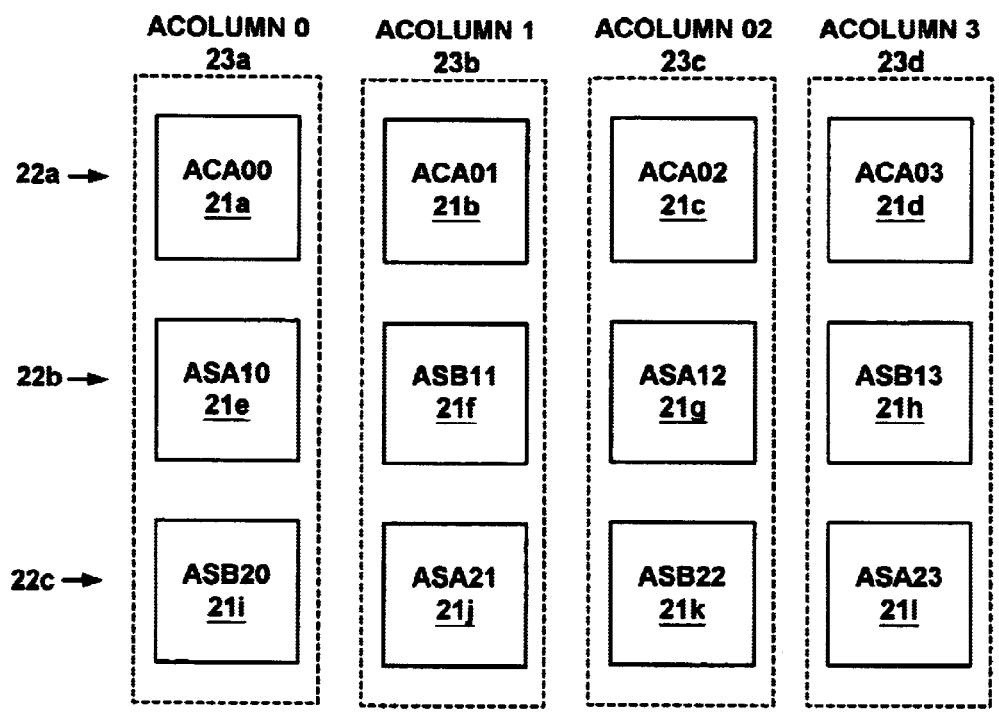
FIG. 2 shows an array of analog blocks in accordance with one embodiment of the present invention.

FIG. 2 shows an array of analog blocks 20 in accordance with one embodiment of the present invention. In this embodiment, there are twelve analog blocks 21a–21l arranged in an array of three rows 22a–22c by four columns 23a–23d. Each column 23a–d includes one of each type of analog block, e.g., a continuous time block 21a–d (designated "ACAxx"); a type A switched capacitor block 21e, 21g, 21j and 21l (designated "ASAxx"); and a type B switched capacitor block 21f, 21h, 21i, and 21k (designated "ASBxx"). Note that, in this embodiment, the type A and type B switched capacitor blocks in rows 22b and 22c are arranged in an alternating, or checkerboard, pattern.

In the present embodiment, the analog blocks 21a–l can be powered down individually to different power levels, so that it is not necessary for all of the blocks to be running at full power. In one embodiment, the analog blocks 21a–l have four power levels.

Figure 3:
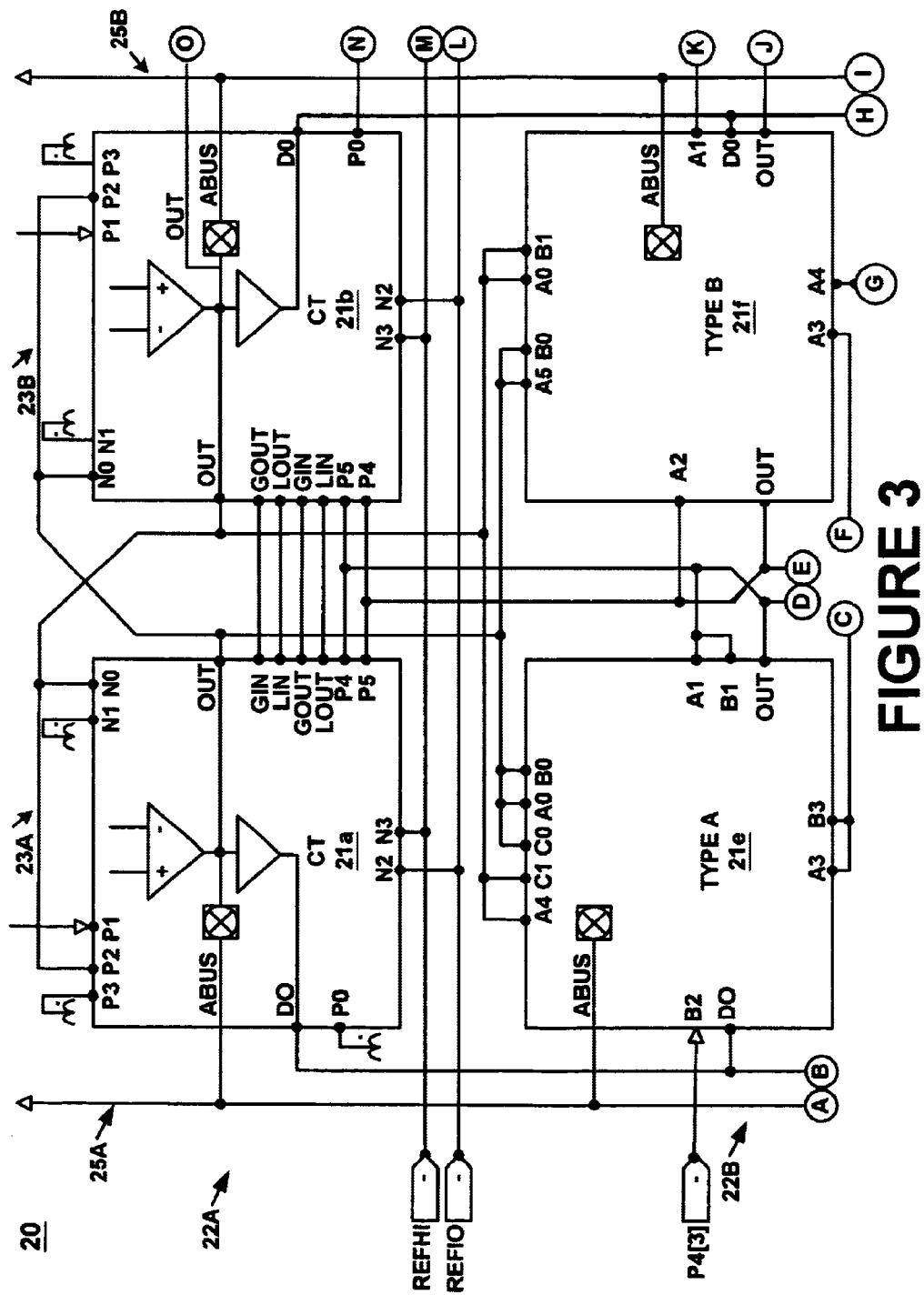
FIG. 3 shows the interconnects between analog blocks in an array in accordance with one embodiment of the present invention.
Figure 3:
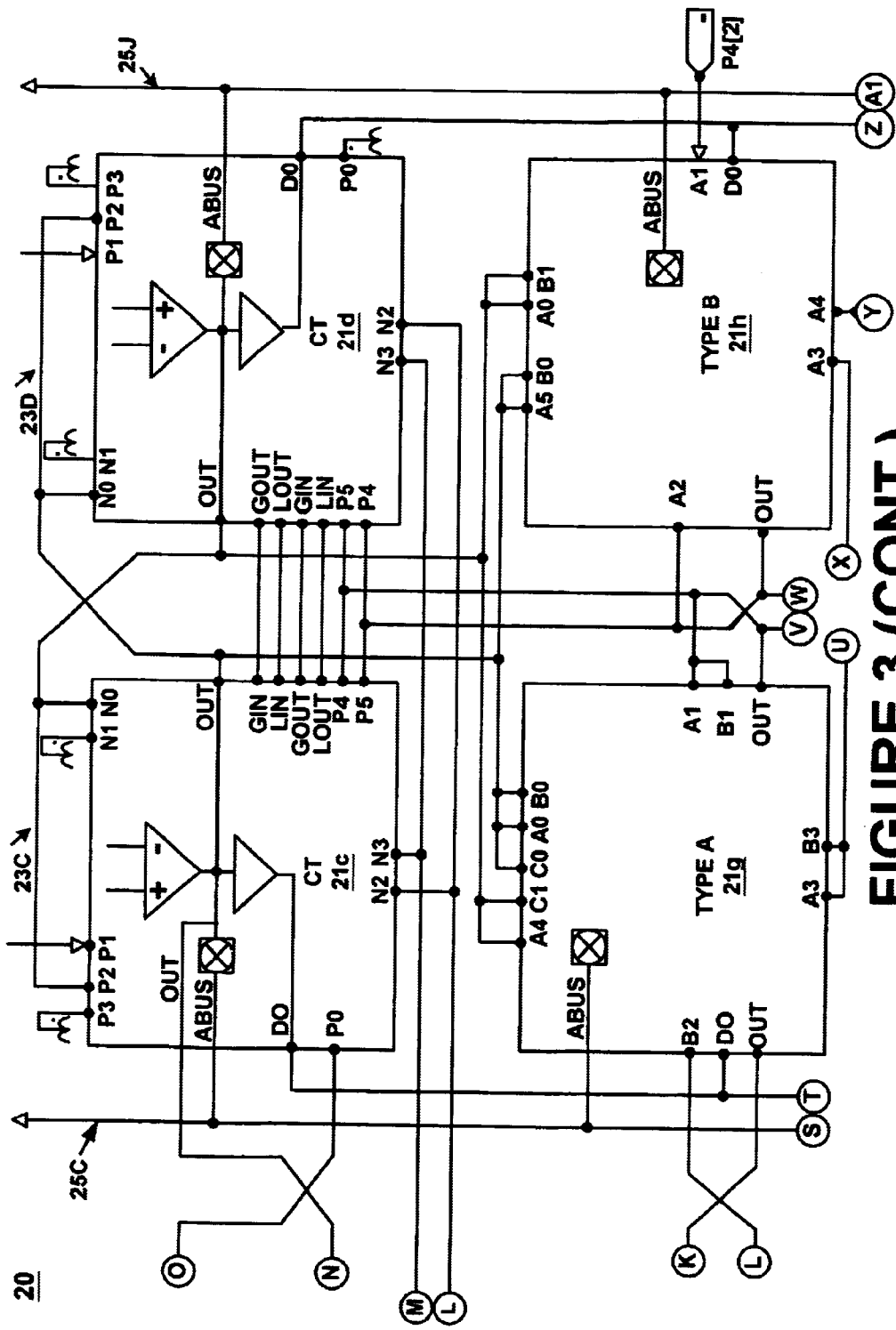
Figure 3:
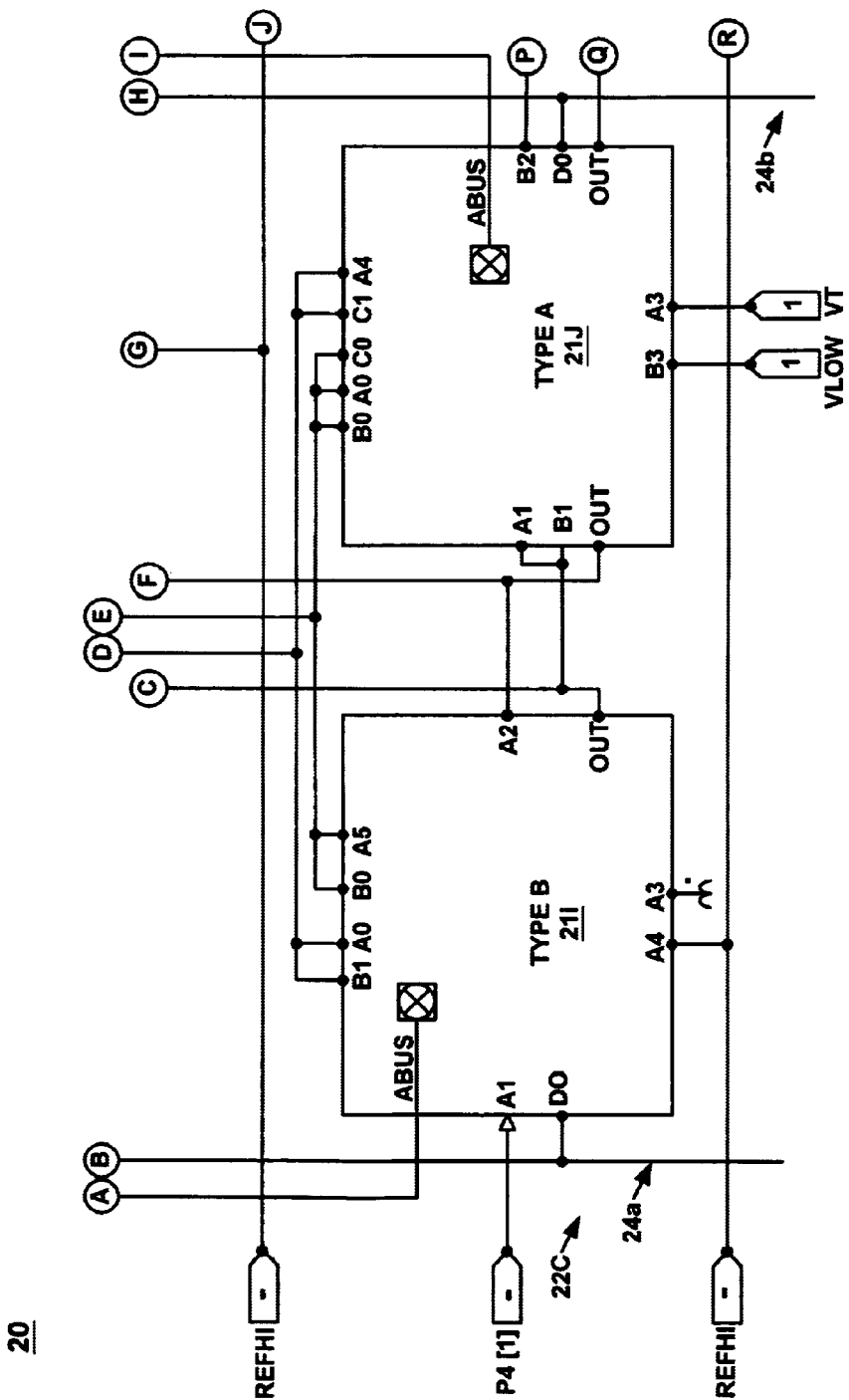
Figure 3:
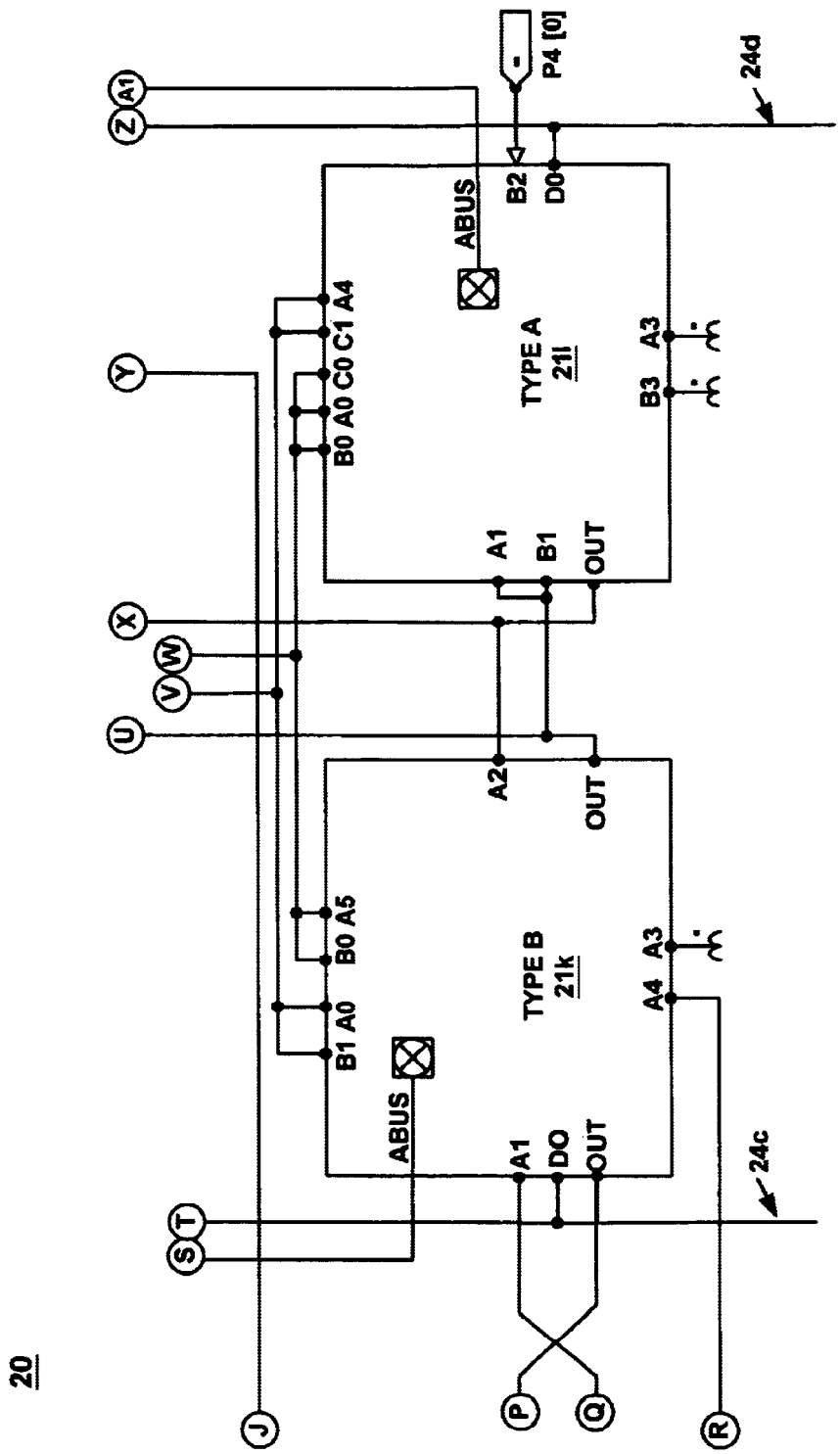

FIG. 3 shows the interconnects between analog blocks 20 in an array in accordance with one embodiment of the present invention. In this embodiment, each analog block 21a–l is interconnected with its adjacent (e.g., nearest neighbor) analog block. Note that, although the analog blocks 21a–l are interconnected, they may not be electrically coupled. The distinction between being connected and being electrically coupled is important because the analog functions performed by the analog blocks 20 are implemented by enabling certain analog blocks of the circuit and bypassing others according to user programming. That is, certain analog blocks in the array of analog blocks 20 are selectively and electrically coupled to other analog blocks according to the function to be performed. As will be seen, the analog functions are also implemented by setting characteristics of passive elements (e.g., capacitors and resistors) within each of the analog blocks 20.

In accordance with the present invention, different combinations of analog blocks 20 can be selected according to the user programming in order to perform different functions. In one embodiment, individual analog blocks can be enabled and bypassed, respectively, by enabling and closing appropriate switches in response to the programming. Signals are thereby routed through the analog blocks 20 by enabling and closing programmable switches, so that the signals are routed to the analog blocks necessary to accomplish the particular analog function selected. Mechanisms other than switches may be used to enable and bypass analog blocks.

In the present embodiment, for each column 23a–d, there is a respective digital bus 24a–d and a respective analog bus 25a–d coupled to each analog block in the column. Any analog block on these buses can have its output enabled to drive the buses. The analog buses 25a–d are each a gated operational amplifier (op-amp) output. The digital buses 24a–d are each a comparator output derived by buffering the operational amplifier output through an inverter. In one embodiment, reference buses (not shown) are also provided to provide a reference voltage for ADC and DAC functions.

In the present embodiment, data essentially flow through the array of analog blocks 20 from top to bottom (e.g., from row 22a to row 22c). The continuous time blocks 21a–d can be programmed to serve as a first-order isolation buffer, if necessary.

In FIG. 3, output signals from each analog block include D0 and those signals that include "out" in their designation (such as OUT, GOUT, and LOUT). Signals labeled otherwise are input signals to a block.

Figure 4A:
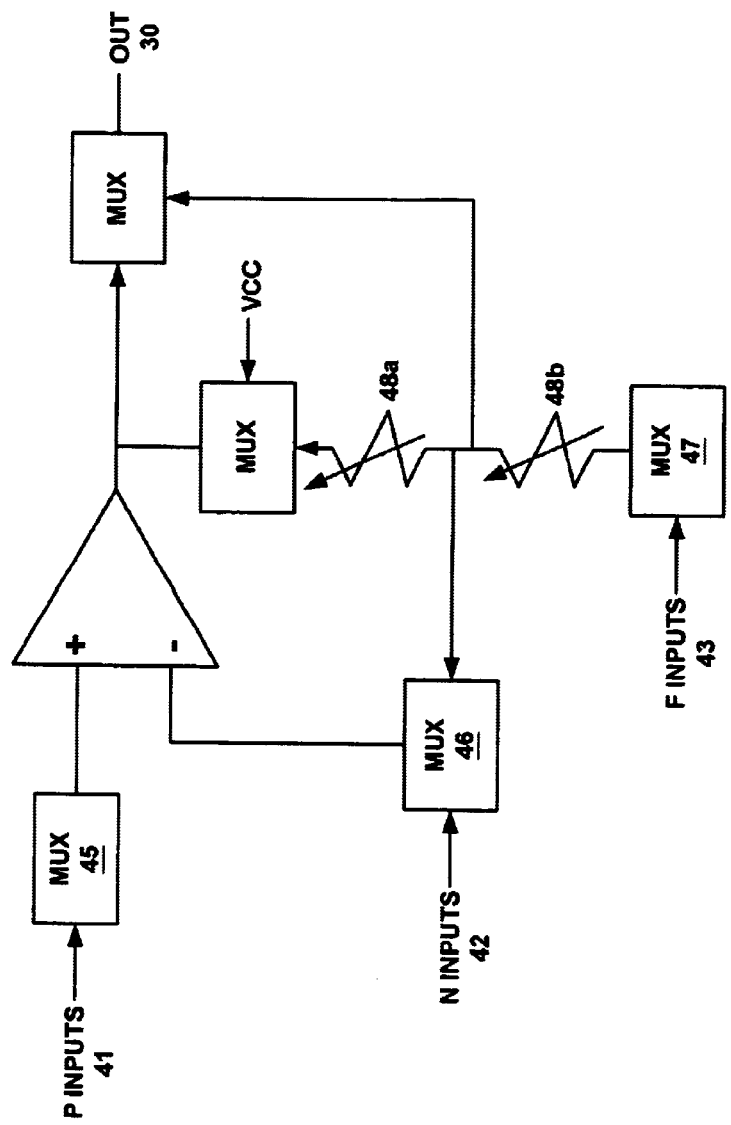
FIG. 4A is a functional block diagram of one embodiment of a continuous time block in accordance with the present invention.

FIG. 4A is a functional block diagram of one embodiment of a continuous time block 40 in accordance with the present invention. Continuous time block 40 exemplifies continuous time blocks 21a–d of FIGS. 2 and 3. Continuous time block 40 is unclocked; that is, an analog signal input to continuous time block 40 may vary with time, and the output of continuous time block 40 will reflect that (instead of sampling the input as a clocked block would).

In the present embodiment, continuous time block 40 of FIG. 4A performs basic amplifier operations. In one embodiment, one function of continuous time block 40 is to amplify and isolate analog inputs to the array of analog blocks 20 (FIG. 3), although continuous time block 40 may not always be used in this manner. Continuous time block 40 also provides the means to convert differential input voltages into single-ended signals to drive other analog blocks 20.

In the present embodiment, continuous time block 40 of FIG. 4A receives positive (P) inputs 41 at multiplexer (MUX) 45, negative (N) inputs 42 at MUX 46, and feedback (F) inputs at MUX 47. Multiplexers 45, 46 and 47 function as controlled switches for directing the inputs through continuous time block 40. It is appreciated that the inputs to continuous time block 40 are a function of the location of continuous time block 40 in the array of analog blocks 20 (FIGS. 2 and 3), and that the inputs received by continuous time block 40 depend on the particular analog function being implemented.

Continuous time block 40 also includes analog elements having characteristics that can be set and changed in response to the users programming in accordance with the particular analog function to be implemented. In the present embodiment, continuous time block 40 includes programmable resistors 48a and 48b. In accordance with the present invention, the resistance of resistors 48a and 48b can be changed in response to the user's programming.

Figure 4B:
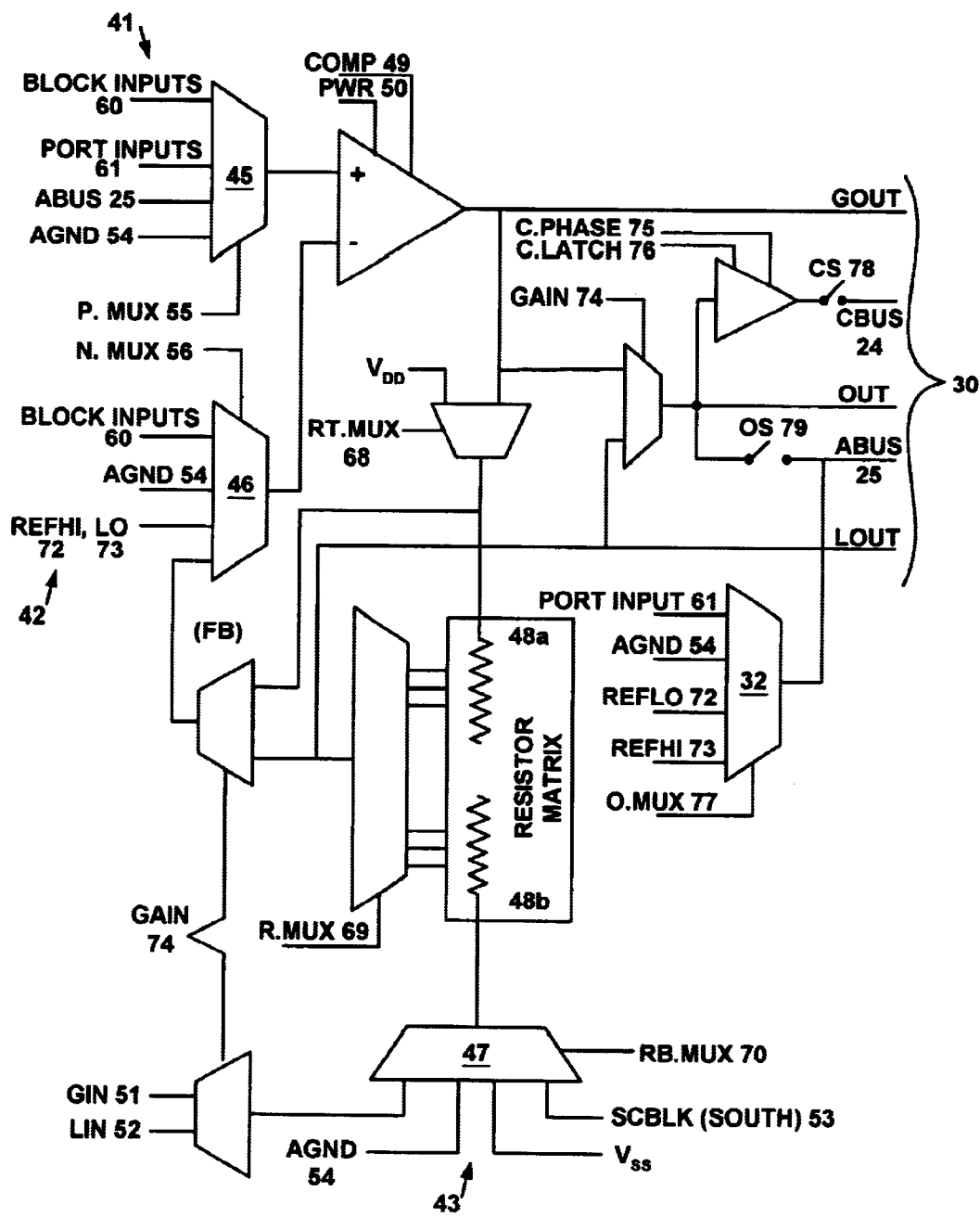
FIG. 4B is a schematic diagram of one embodiment of a continuous time block in accordance with the present invention.

FIG. 4B is a schematic diagram of one embodiment of a continuous time block 40 in accordance with the present invention. Block inputs 60 are inputs received from other analog blocks in the array of analog blocks 20 (FIG. 2). SCBLK (SOUTH) 53 is the input from a switched capacitor block below continuous time block 40 in a column 23a–d (FIG. 3). Port inputs 61 are inputs received from components and elements external to the array of analog blocks 20.

ABUS 25 is the input from the analog bus (e.g., analog buses 25a–d of FIG. 3) and AGND 54 is the analog ground. CBUS 24 is the output to the digital bus (e.g., buses 24a–d of FIG. 3). Other outputs (OUT) 30 include GOUT, OUT and LOUT (see FIG. 3). When cascading two blocks, GOUT is used when trying to achieve a gain, and LOUT is used when trying to achieve a loss. REFLO 72 and REFHI 73 are reference voltages.

Continuing with reference to FIG. 4B, GAIN 74 controls whether the resistor string (48a, 48b) is connected around the op-amp for gain or loss (note that GAIN 74 does not guarantee a gain or loss block; this is determined by the routing of the other ends of the resistors 48a–b). GIN 51 and LIN 52 are inputs to continuous time block 40 (see also FIG. 3). P.MUX 55, N.MUX 56 and RB.MUX 70 are bit streams which control the non-inverting input MUX 45, the inverting input MUX 46, and MUX 47, respectively. R.MUX 69 is a bit stream controlling the center tap of the resistor string 48a–b. RT.MUX 68 is a bit stream controlling the connection of the two ends of the resistor string 48a–b. RT.MUX bits 68 control the top end of the resistor string 48a–b, which can either be connected to Vcc or to the op-amp output. RB.MUX bits 70 control the connection of the bottom end of the resistor string 48a–b.

With reference still to FIG. 4B, MUX 32 under control of bit stream O.MUX 77 provides a testability feature by feeding signals into continuous time block 40 that bypass the other portions of the block. COMP 49 is a bit controlling whether the compensation capacitor (not shown) is switched in or not in the op-amp. By not switching in the compensation capacitance, a fast response can be obtained if the amplifier is being used as a comparator.

PWR 50 is a bit stream for encoding the power level for continuous time block 40. C.PHASE 75 controls which internal clock phase the comparator data are latched on. C.LATCH 76 controls whether the latch is active or if it is always transparent. CS 78 controls a tri-state buffer that drives the comparator logic. OS 79 controls the analog output bus (ABUS 25). A complementary metal oxide semiconductor (CMOS) switch connects the op-amp output to ABUS 25.

Figure 5:
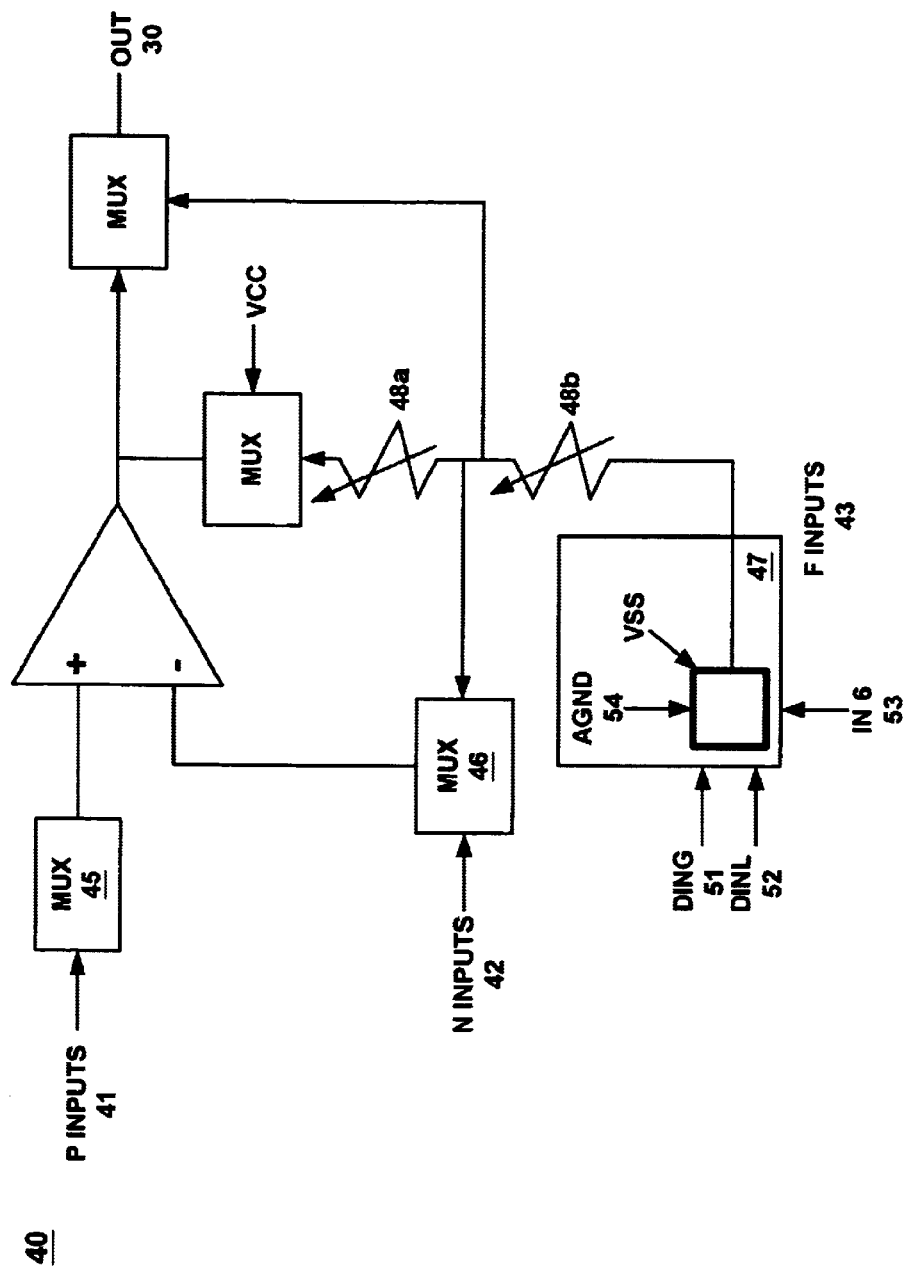
FIG. 5 illustrates the feedback inputs into a continuous time block in accordance with one embodiment of the present invention.

FIG. 5 illustrates the feedback inputs 43 into a continuous time block 40 in accordance with one embodiment of the present invention. DING 51 is GIN 51 of FIG. 4B, DINL 52 is LIN 52 of FIG. 4B, and AGND 54 is the analog (actual) ground. IN6 (SCBLK) 53 is the input from a switched capacitor block situated below continuous time block 40 in a column 23a–d in an array of analog blocks 20 (FIG. 3).

Figure 6:
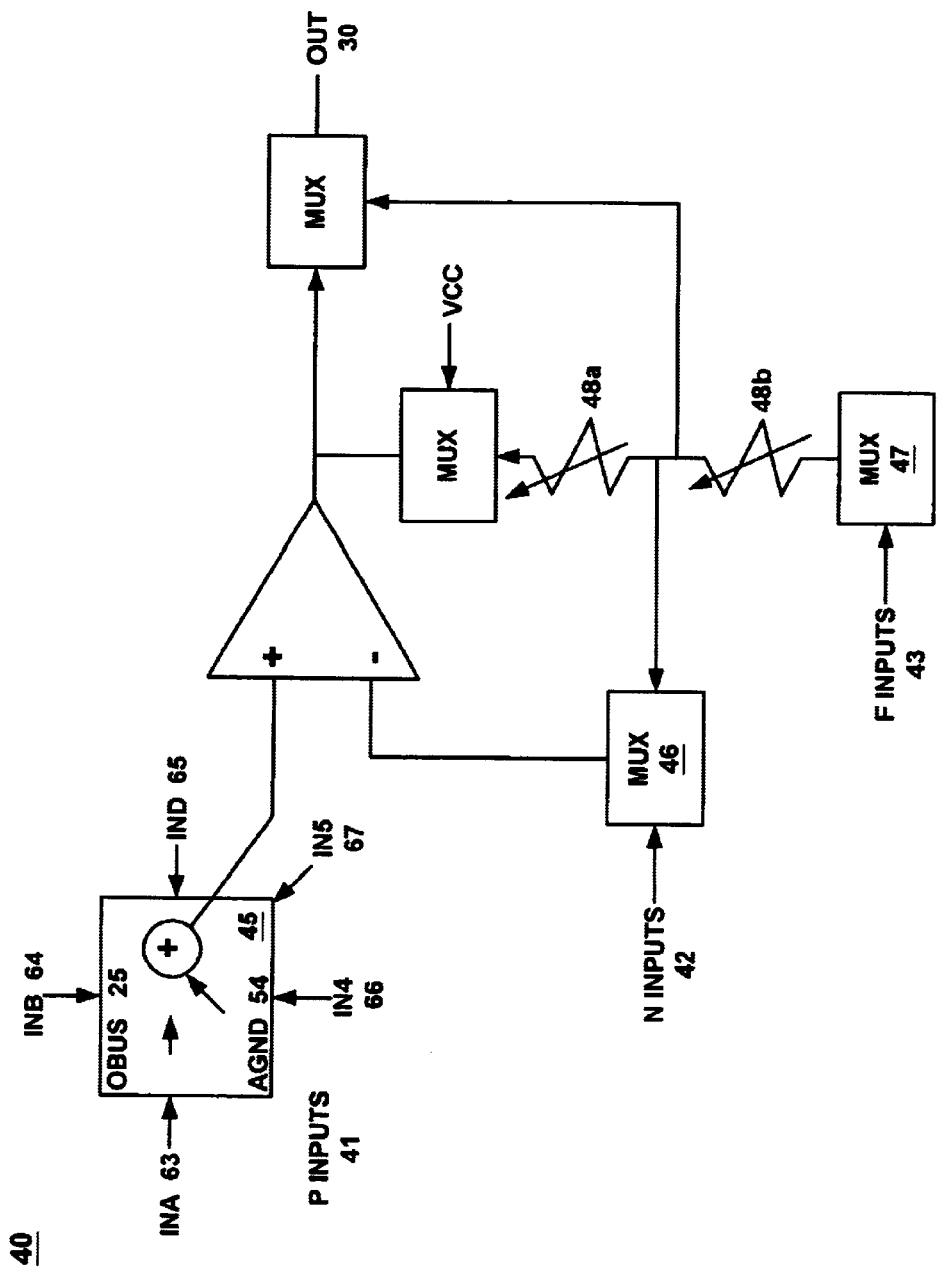
FIG. 6 illustrates the positive inputs into a continuous time block in accordance with one embodiment of the present invention.

FIG. 6 illustrates the positive inputs 41 into a continuous time block 40 in accordance with one embodiment of the present invention. AGND 54 is the analog ground, and OBUS (ABUS) 25 is the input from the analog bus (e.g., analog buses 25a–d of FIG. 3). INA 63 and IND 65 are the inputs from another continuous time block; that is, the continuous time blocks to either side of continuous time block 40. If continuous time block 40 is situated on the left or right edge of the array of analog blocks 20 (FIG. 3), such as in columns 23a or 23d, then only one of the inputs INA 63 or IND 65 would be present. INB 64 is the input from outside of the array of analog blocks 20. IN4 66 and IN5 67 are input from adjacent switched capacitor blocks, either in the same column as continuous time block 40 or from a switched capacitor block in an adjacent column.

Figure 7:
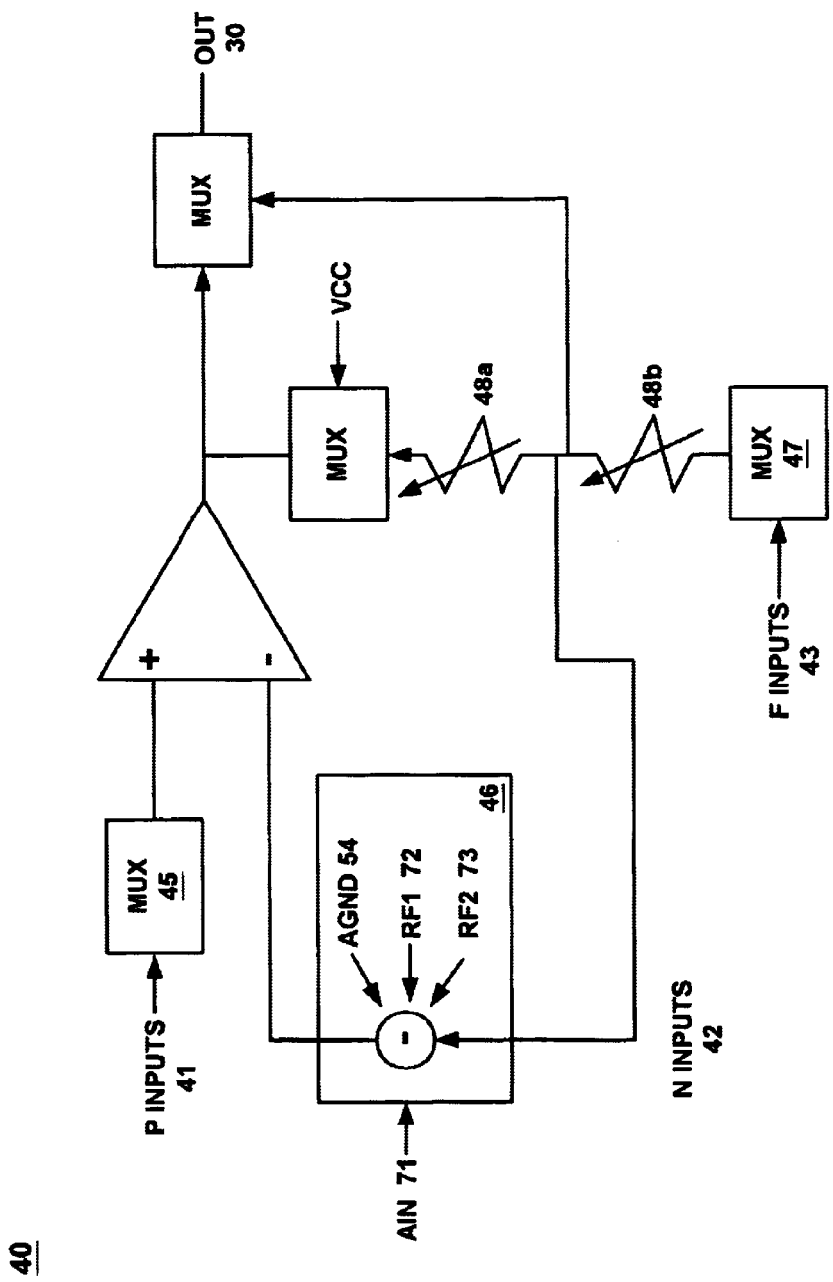
FIG. 7 illustrates the negative inputs into a continuous time block in accordance with one embodiment of the present invention.

FIG. 7 illustrates the negative inputs 42 into a continuous time block 40 in accordance with one embodiment of the present invention. AGND 54 is the analog ground, and AIN 71 is the input from an adjacent continuous time block (depending on the location of continuous time block 40 in the array of analog blocks 20 of FIG. 3, there may be more than one input from an adjacent continuous time block, as described in the preceding paragraph). RF1 (REFLO) 72 and RF2 (REFHI) 73 are reference voltages.

Figure 8A:
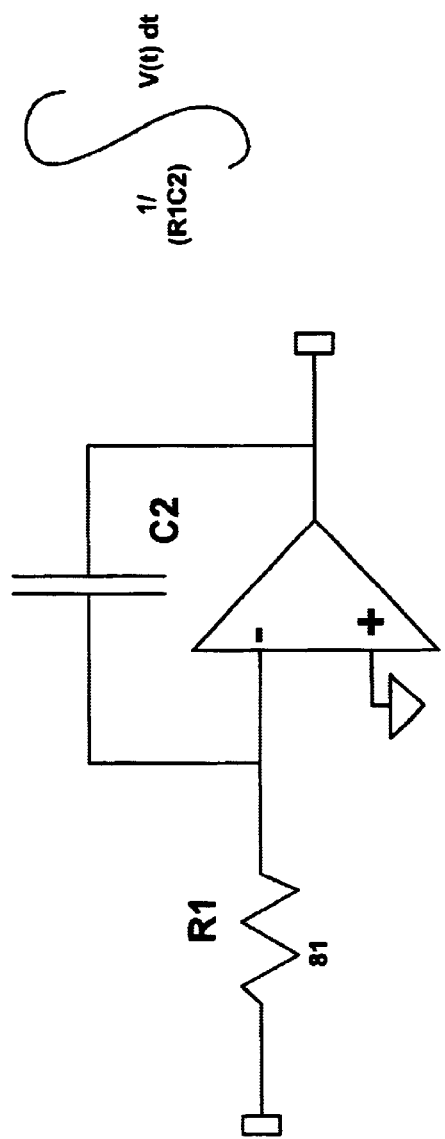
FIGS. 8A and 8B are circuit diagrams illustrating the functionality of a switched capacitor circuit by comparison to another circuit in accordance with one embodiment of the present invention.
Figure 8B:
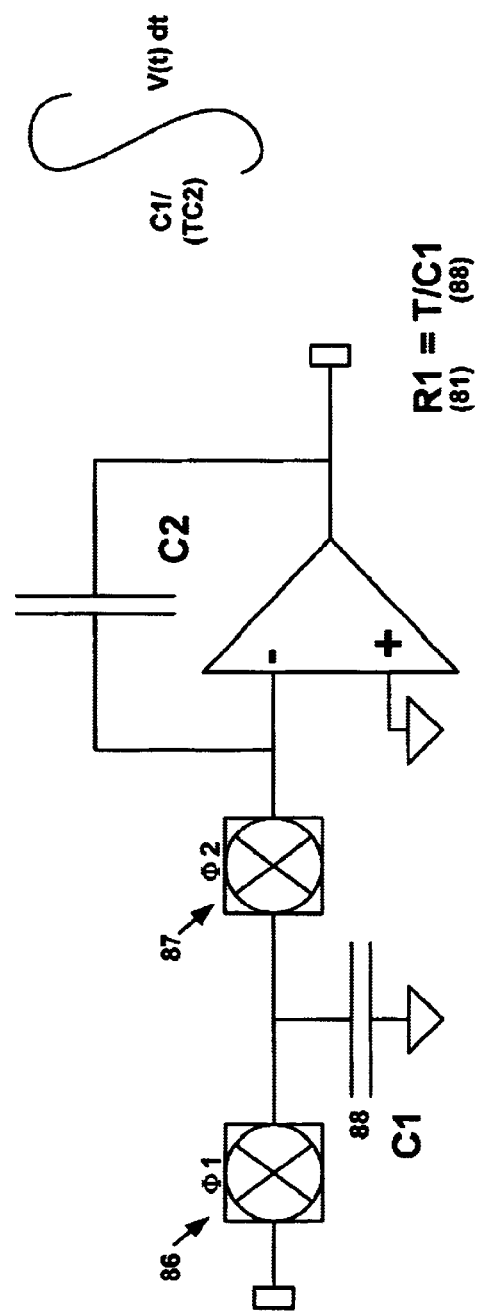

FIGS. 8A and 8B are circuit diagrams illustrating the functionality of a switched capacitor circuit 85 by comparison to another circuit 80 in accordance with one embodiment of the present invention. In FIG. 8A, an amount of current flows through resistor 81 in a time period T. Resistor 81 has a resistance value of R1. In FIG. 8B, switch 86 and switch 87 of switched capacitor circuit 85 are enabled and closed according to clock phases $\phi 1$ and $\phi 2$, respectively. Switched capacitor circuit 85 also includes a capacitor 88 with a capacitance of C1. An amount of charge will transfer through switches 86 and 87 in a time period T. In essence, the amount of charge transferred through switches 86 and 87 in time period T will appear like a current (current being charge per time). The resistance of switched capacitor circuit 85 equivalent to R1 is T/C1.

Figure 9A:
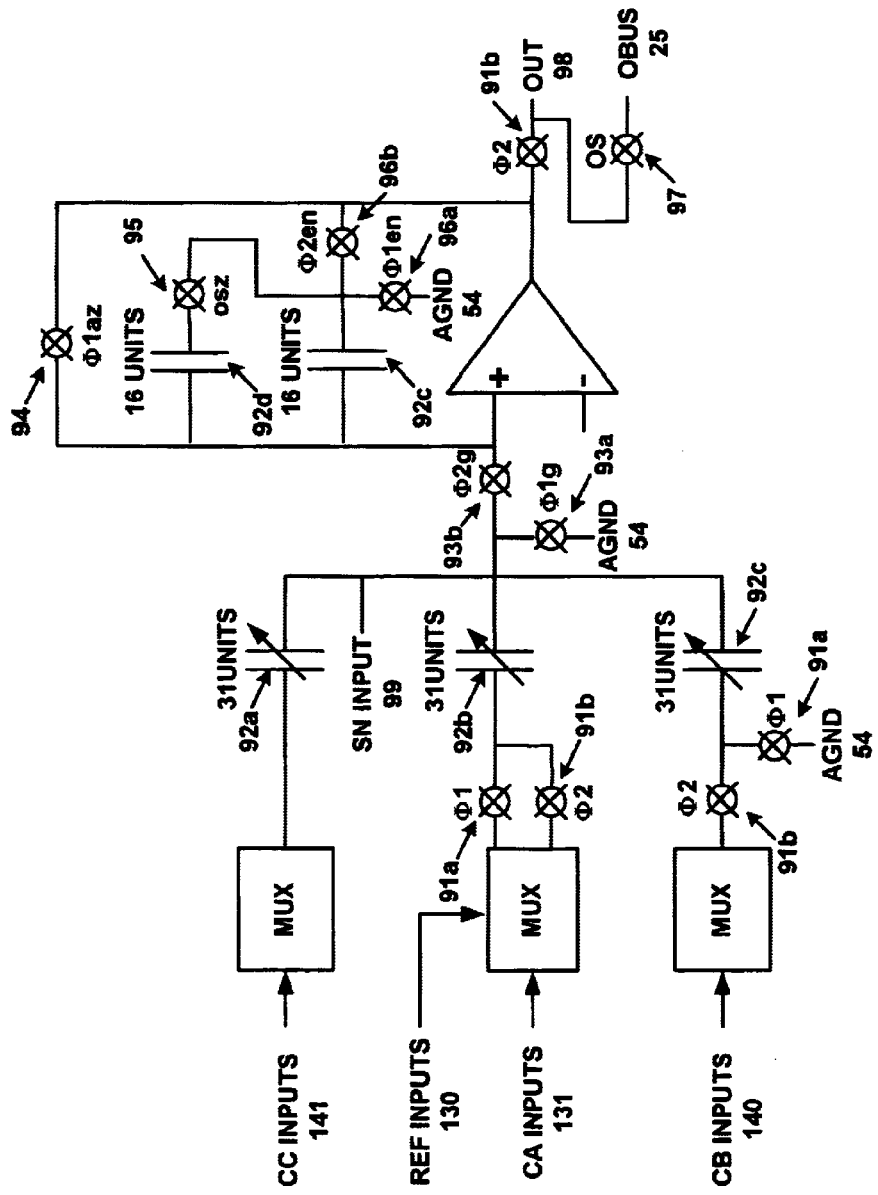
FIG. 9A is a block diagram of one embodiment of a switched capacitor block in accordance with the present invention.

FIG. 9A is a block diagram of one embodiment of a switched capacitor block 90 in accordance with the present invention. This embodiment of switched capacitor block 90 is referred to as a type A switched capacitor block. Switched capacitor block 90 exemplifies analog blocks 21e, 21g, 21j and 21l of FIGS. 2 and 3.

With reference to FIG. 9A, the present embodiment of switched capacitor block 90 receives reference (REF) inputs 130, SN input 99, and inputs from three different types of capacitor arrays, CA inputs 131, CB inputs 140 and CC inputs 141. The designations "CA," "CB" and "CC" are simply chosen to distinguish the three different types of capacitor arrays. REF inputs 130 and CA inputs 131 are described further in conjunction with FIG. 10, and CB inputs 140 and CC inputs 141 are described further in conjunction with FIG. 11. SN input 99 is a summary node of the array of analog blocks 20 (FIG. 3). It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Continuing with reference to FIG. 9A, AGND 54 is the analog ground, OBUS (ABUS) 25 is the output to the analog bus (e.g., analog buses 25a–d of FIG. 3), and OUT 98 is an output from switched capacitor block 90 that may serve as an input to an adjacent switched capacitor block (refer to FIG. 3).

In the present embodiment, switched capacitor block 90 includes a multiplicity of switches 91a, 91b, 93a, 93b, 94, 95, 96a, 96b and 97. Each of the switches 91a–b, 93a–b, 94, and 96a–b is assigned to a clock phase $\phi 1$ or $\phi 2$; that is, they are enabled or closed depending on the clock phase. Switches 93a–b, 94, and 96a–b are assigned to gated clocks and function in a known manner. Switches 95 and 97 are not clocked but instead are enabled or closed depending on the user's programming.

Switched capacitor block 90 also includes analog elements having characteristics that can be set and changed in response to the user's programming in accordance with the particular analog function to be implemented. In the present embodiment, switched capacitor block 90 includes capacitors 92a–92e. In accordance with the present invention, the capacitance of capacitors 92a–e can be changed in response to the user's programming. In the present embodiment, the capacitors 92a–c are binarily weighted capacitors that allow the capacitor weights to be programmed by the user, while the capacitors 92d–e are either "in" or "out" (that is, they are not binarily weighted) according to the user programming. In one embodiment, the binary encoding of capacitor size for capacitors 92a–c comprises 31 units (plus zero) each and the encoding of capacitor size for capacitors 92d–e is 16 units each.

Switched capacitor block 90 is configured such that it can be used for the input stage of a switched capacitor biquad filter. When followed by a type B switched capacitor block, the combination of blocks provides a complete switched capacitor biquad (see FIGS. 14A and 14B).

Figure 9B:
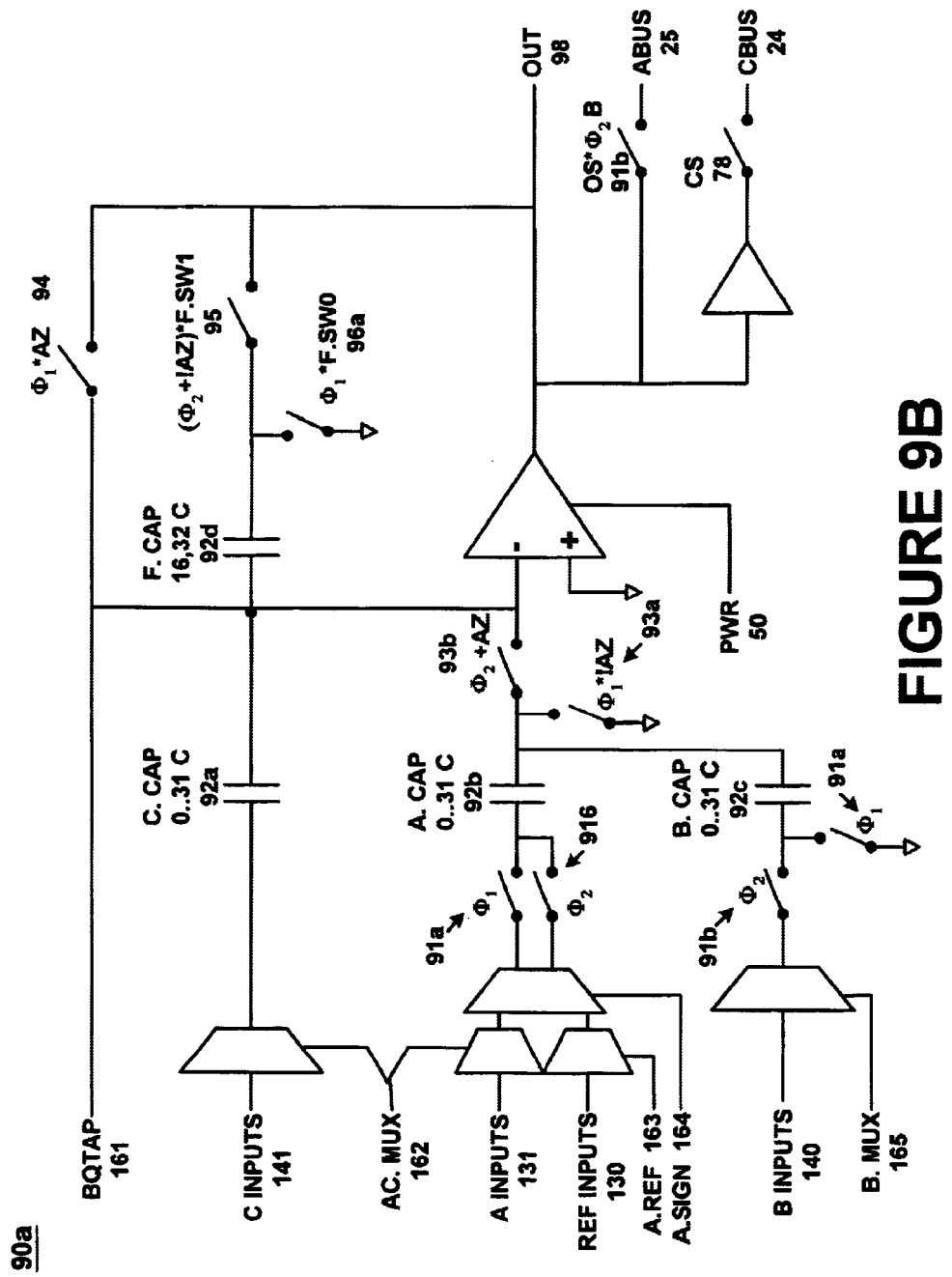
FIG. 9B is a schematic diagram of the switched capacitor block of FIG. 9A in accordance with one embodiment of the present invention.

FIG. 9B is a schematic diagram of a switched capacitor block 90a in accordance with one embodiment of the present invention. ABUS 25 is the output to the analog bus (e.g., buses 25a–d of FIG. 3). CBUS 24 is the output to the digital bus (e.g., buses 24a–d of FIG. 3). PWR 50 is a bit stream for encoding the power level for switched capacitor block 90a. CS 78 controls the output to CBUS 24.

Continuing with reference to FIG. 9B, BQTAP 161 is used when switched capacitor block 90a is used with a type B switched capacitor block to form a switched capacitor biquad (refer to FIGS. 14A and 14B below). AC.MUX 162 is for controlling the multiplexing of the inputs for both the C (CC) inputs 141 and the A (CA) inputs 131. A.REF 163 is for controlling the reference voltage inputs (REF 130). A.SIGN 164 controls the switch phasing of the switches on the bottom plate of the capacitor 92b. B.MUX 165 is for controlling the multiplexing of the inputs for the B (CB) inputs 140.

Figure 10:
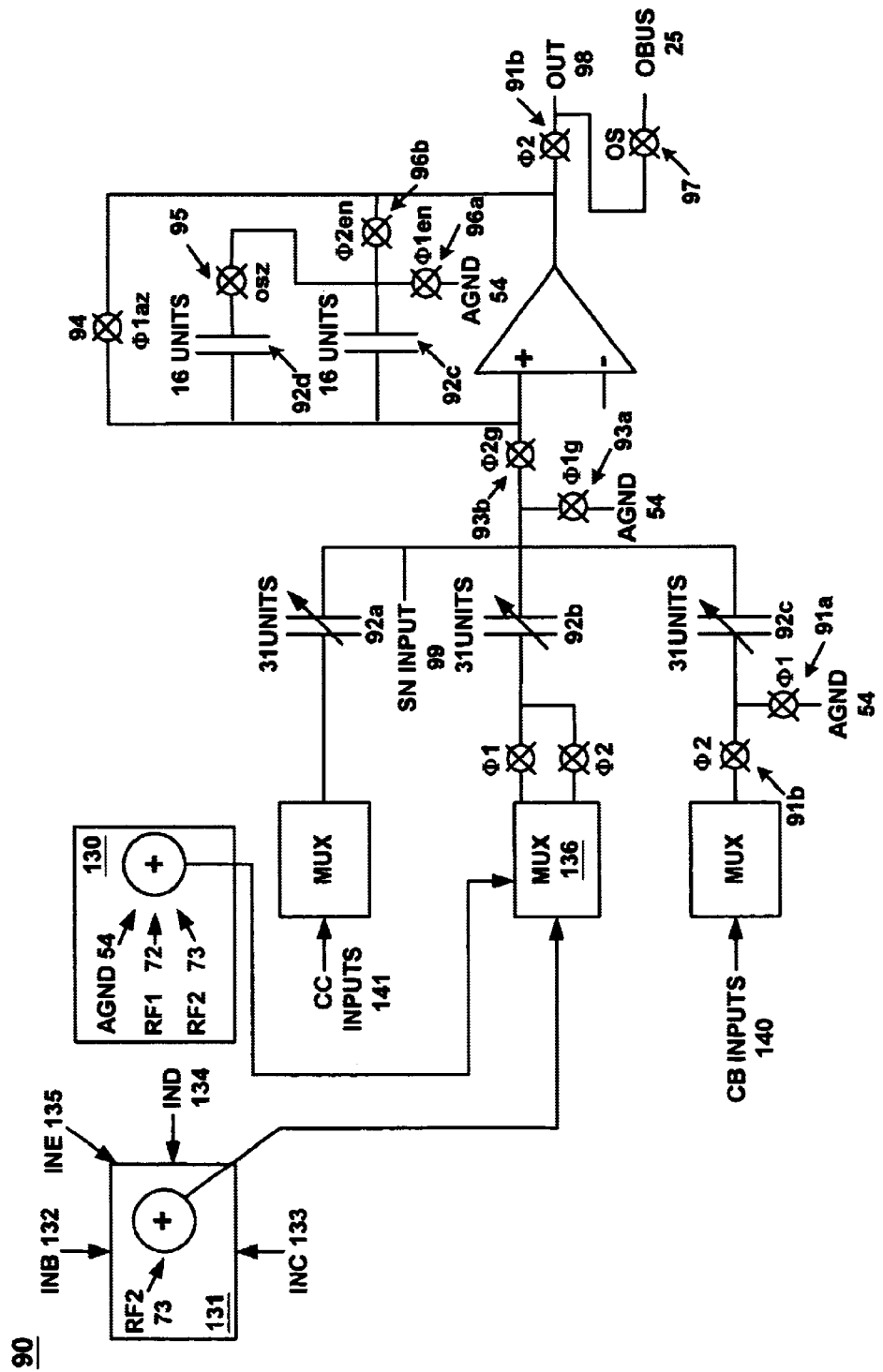
FIG. 10 shows one set of inputs into the switched capacitor block of FIG. 9A in accordance with one embodiment of the present invention.

FIG. 10 shows one set of inputs into one embodiment of a type A switched capacitor block 90 in accordance with the present invention. It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Referring to FIG. 10, REF inputs 130 includes the analog ground AGND 54 and reference voltages RF1 (REFLO) 72 and RF2 (REFHI) 73. CA inputs 131 can include inputs INB 132, INC 133, IND 134 and INE 135 from a continuous time block and/or switched capacitor block adjacent to switched capacitor block 90. CA inputs 131 can also include reference voltage RF2 (REFHI) 73 from a continuous time block and/or switched capacitor block adjacent to switched capacitor block 90. MUX 136 can be programmed so that either CA inputs 131 or REF inputs 130 are sampled on clock phase ϕ1, thereby allowing inverting or non-inverting configurations. The selection of RF1 (REFLO) 72 and RF2 (REFHI) 73 can be controlled by a comparator (not shown).

Figure 11:
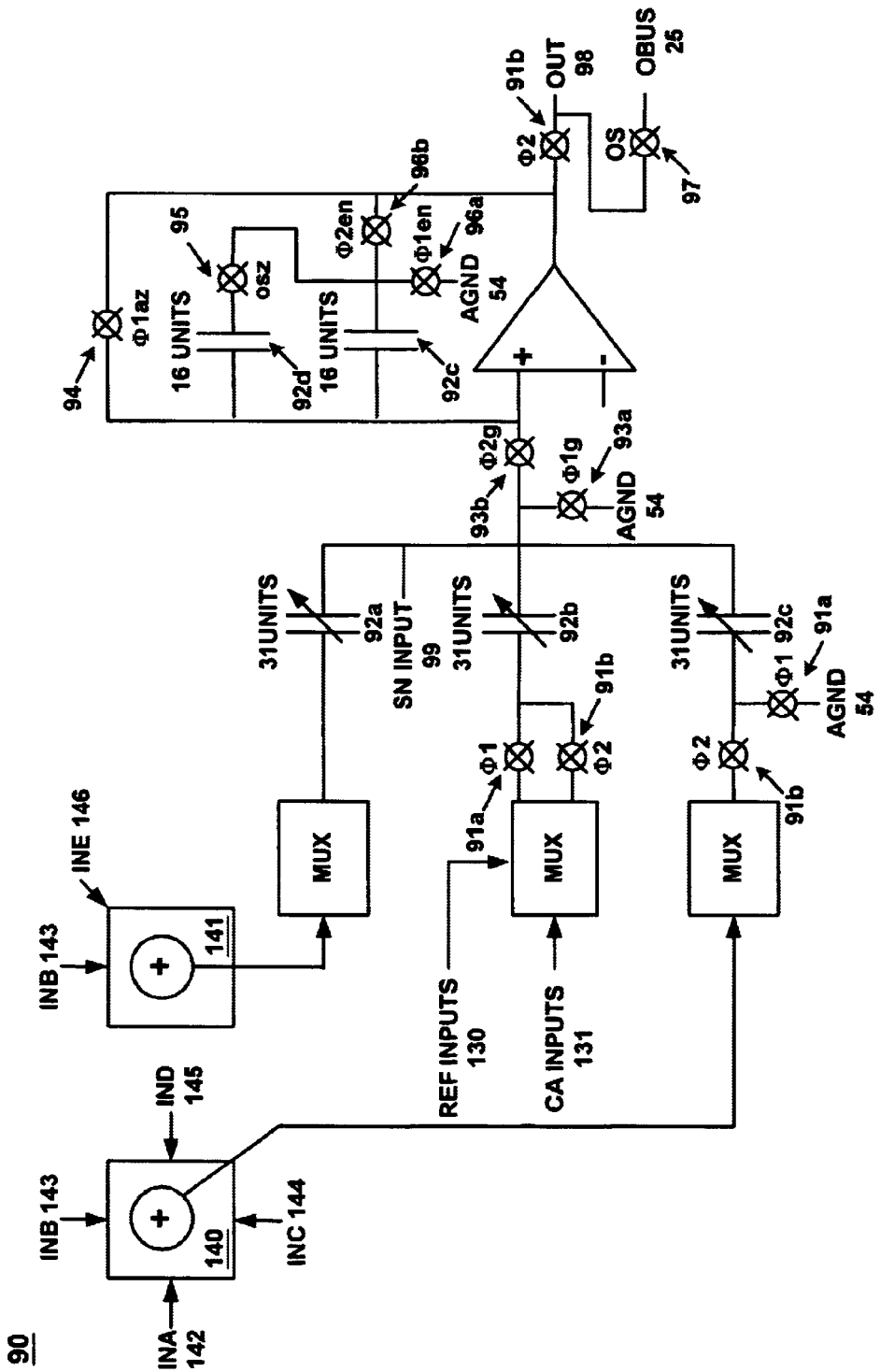
FIG. 11 shows the other set of inputs into the switched capacitor block of FIG. 9A in accordance with one embodiment of the present invention.

FIG. 11 shows the other set of inputs into the type A switched capacitor block 90 of FIG. 9A in accordance with the present invention. As previously mentioned, the inputs to switched capacitor block 90 are a function of the location of switched capacitor block 90 in the array of analog blocks 20 (FIGS. 2 and 3), and the inputs received by switched capacitor block 90 depend on the particular analog function being implemented.

With reference to FIG. 11, CB inputs 140 can include inputs INA 142, INB 143, INC 144 and IND 145 from a continuous time block and/or switched capacitor block adjacent to switched capacitor block 90. CC inputs 141 can include INB 143 and INE 146 from a continuous time block and/or switched capacitor block adjacent to switched capacitor block 90.

Figure 12A:
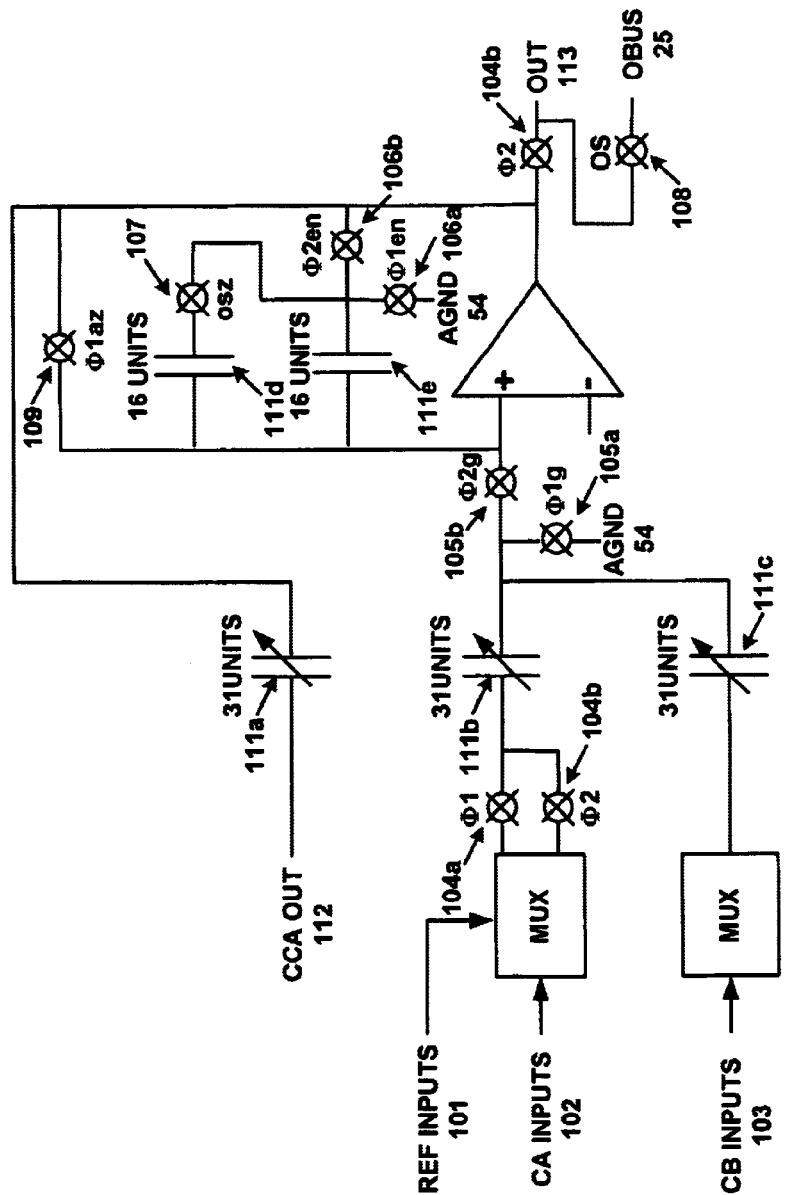
FIG. 12A is a block diagram of another embodiment of a switched capacitor block in accordance with the present invention.

FIG. 12A is a block diagram of another embodiment of a switched capacitor block 100 in accordance with the present invention. This embodiment of switched capacitor block 100 is referred to as a type B switched capacitor block. Switched capacitor block 100 exemplifies analog blocks 21f, 21h, 21i and 21k of FIGS. 2 and 3.

With reference to FIG. 12A, the present embodiment of switched capacitor block 100 receives reference (REF) inputs 101, CCAOUT outputs 112, and inputs from two different types of capacitor arrays, CA inputs 102 and CB inputs 103. The designations "CA" and "CB" are chosen to distinguish the two different types of capacitor arrays that are inputs to switched capacitor block 100, and they may be different from the CA inputs 131 and CB inputs 140 of FIG. 9A. REF inputs 101, CA inputs 102 and CB inputs 103 are described further in conjunction with FIG. 13. CCAOUT 112 is a non-switched capacitor feedback from the output. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

Continuing with reference to FIG. 12A, AGND 54 is the analog ground, OBUS (ABUS) 25 is the output to the analog bus (e.g., analog buses 25a–d of FIG. 3), and OUT 113 is an output from switched capacitor block 100 that may serve as an input to an adjacent switched capacitor block (refer to FIG. 3).

In the present embodiment, switched capacitor block 100 includes a multiplicity of switches 104a, 104b, 105a, 105b, 106a, 106b, 107, 108 and 109. Each of the switches 104a–b, 105a–b, 106a–b and 109 is assigned to a clock phase ϕ1 or ϕ2; that is, they are enabled or closed depending on the clock phase. Switches 105a–b, 106a–b and 109 are assigned to gated docks and function in a known manner. Switches 107 and 108 are not clocked but instead are enabled or closed depending on the user's programming.

Switched capacitor block 100 also includes analog elements having characteristics that can be set and changed in response to the users programming in accordance with the particular analog function to be implemented. In the present embodiment, switched capacitor block 100 includes programmable capacitors 111a–111e. In accordance with the present invention, the capacitance of capacitors 111a–e can be changed in response to the user's programming. In the present embodiment, the capacitors 111a–c are binarily weighted capacitors that allow the capacitor weights to be programmed by the user, while the capacitors 111d–e are either "in" or "out" (that is, they are not binarily weighted) according to the user programming. In one embodiment, the binary encoding of capacitor size for capacitors 111a–c comprises 31 units (plus zero) each and the encoding of capacitor size for capacitors 111d–e is 16 units each.

Switched capacitor block 100 is configured such that it can be used for the output stage of a switched capacitor biquad filter. When preceded by a type A switched capacitor block, the combination of blocks provides a complete switched capacitor biquad (see FIGS. 14A and 14B).

Figure 12B:
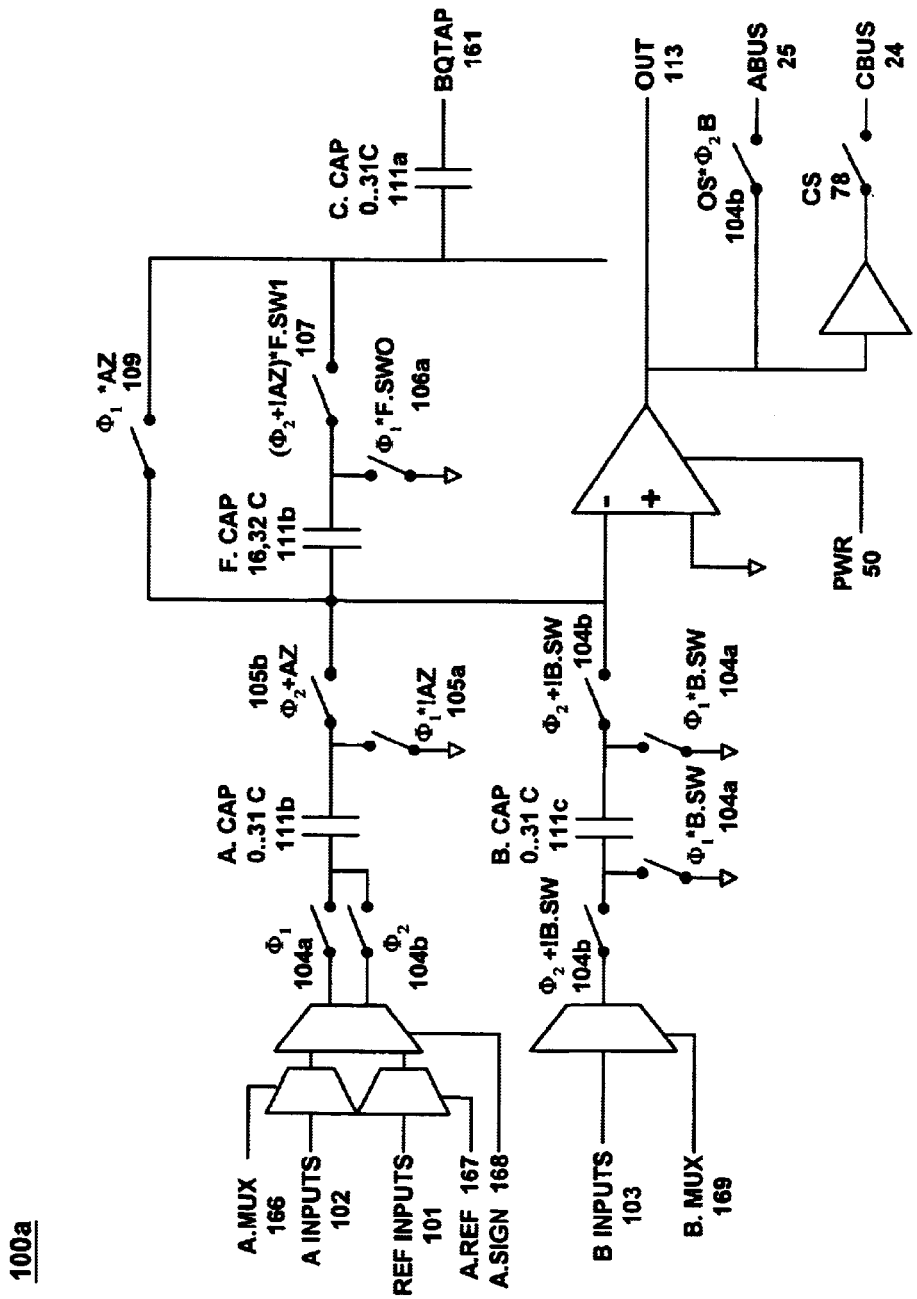
FIG. 12B is a schematic diagram of the switched capacitor block of FIG. 12A in accordance with one embodiment of the present invention.

FIG. 12B is a schematic diagram of a switched capacitor block 100a in accordance with one embodiment of the present invention. ABUS 25 is the output to the analog bus (e.g., buses 25a–d of FIG. 3). CBUS 24 is the output to the digital bus (e.g., buses 24a–d of FIG. 3). PWR 50 is a bit stream for encoding the power level for switched capacitor block 90a. CS 78 controls the output to CBUS 24.

Continuing with reference to FIG. 12B, BQTAP 161 is used when switched capacitor block 100a is used with a type A switched capacitor block to form a switched capacitor biquad (refer to FIGS. 14A and 14B below). A.MUX 166 is for controlling the multiplexing of the inputs for the A (CA) inputs 102. A.REF 167 is for controlling the reference voltage inputs (REF inputs 101). A.SIGN 168 controls the switch phasing of the switches on the bottom plate of the-capacitor 111b; the bottom plate samples the input or the reference. B.MUX 169 is for controlling the multiplexing of the inputs for the B (CB) inputs 103.

Figure 13:
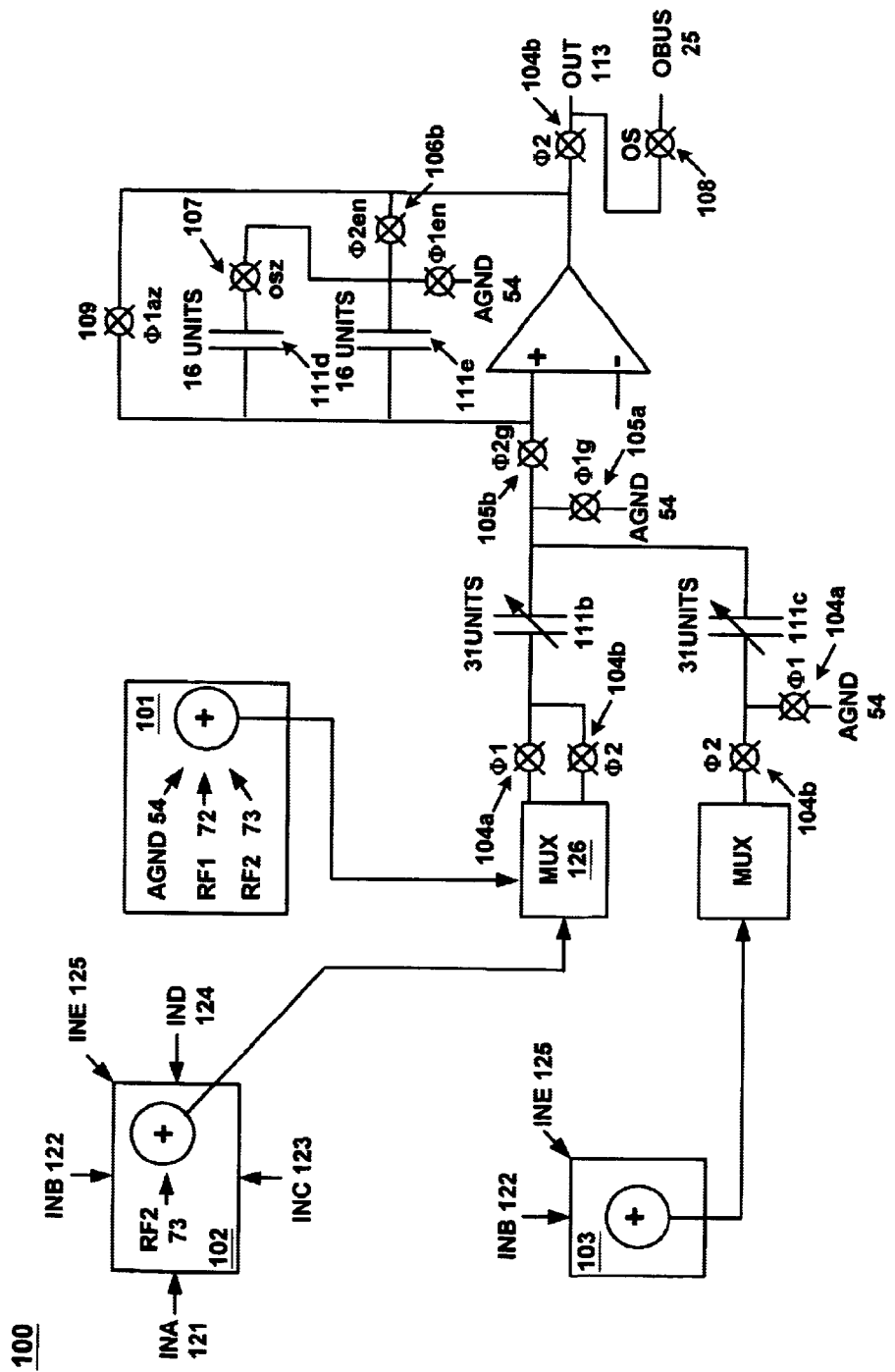
FIG. 13 shows the inputs into the switched capacitor block of FIG. 12A in accordance with one embodiment of the present invention.

FIG. 13 shows the inputs into one embodiment of a type B switched capacitor block 100 in accordance with the present invention. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

With reference to FIG. 13, REF inputs 101 includes the analog ground AGND 54 and reference voltages RF1 (REFLO) 72 and RF2 (REFHI) 73. CA inputs 102 can include inputs INA 121, INB 122, INC 123, IND 124 and INE 125 from a continuous time block and/or switched capacitor block adjacent to switched capacitor block 100. CB inputs 103 can include INB 122 and INE 125 from a continuous time block and/or switched capacitor block adjacent to switched capacitor block 100. MUX 126 can be programmed so that either CA inputs 102 or REF inputs 101 are sampled on clock phase φ1, thereby allowing inverting or non-inverting configurations.

Figure 14A:
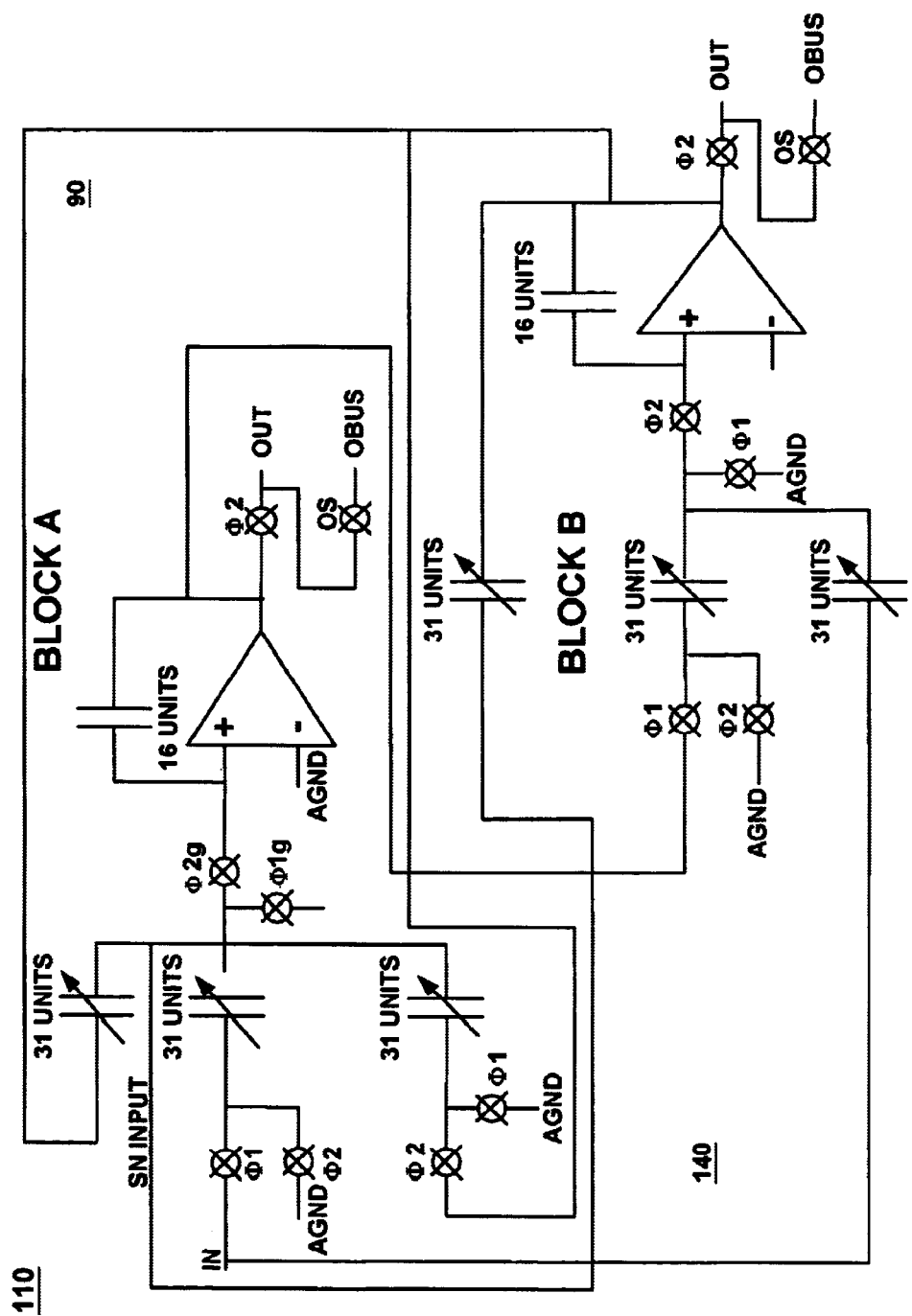
FIG. 14A is a block diagram showing one embodiment of a switched capacitor biquad in accordance with the present invention.
Figure 14B:
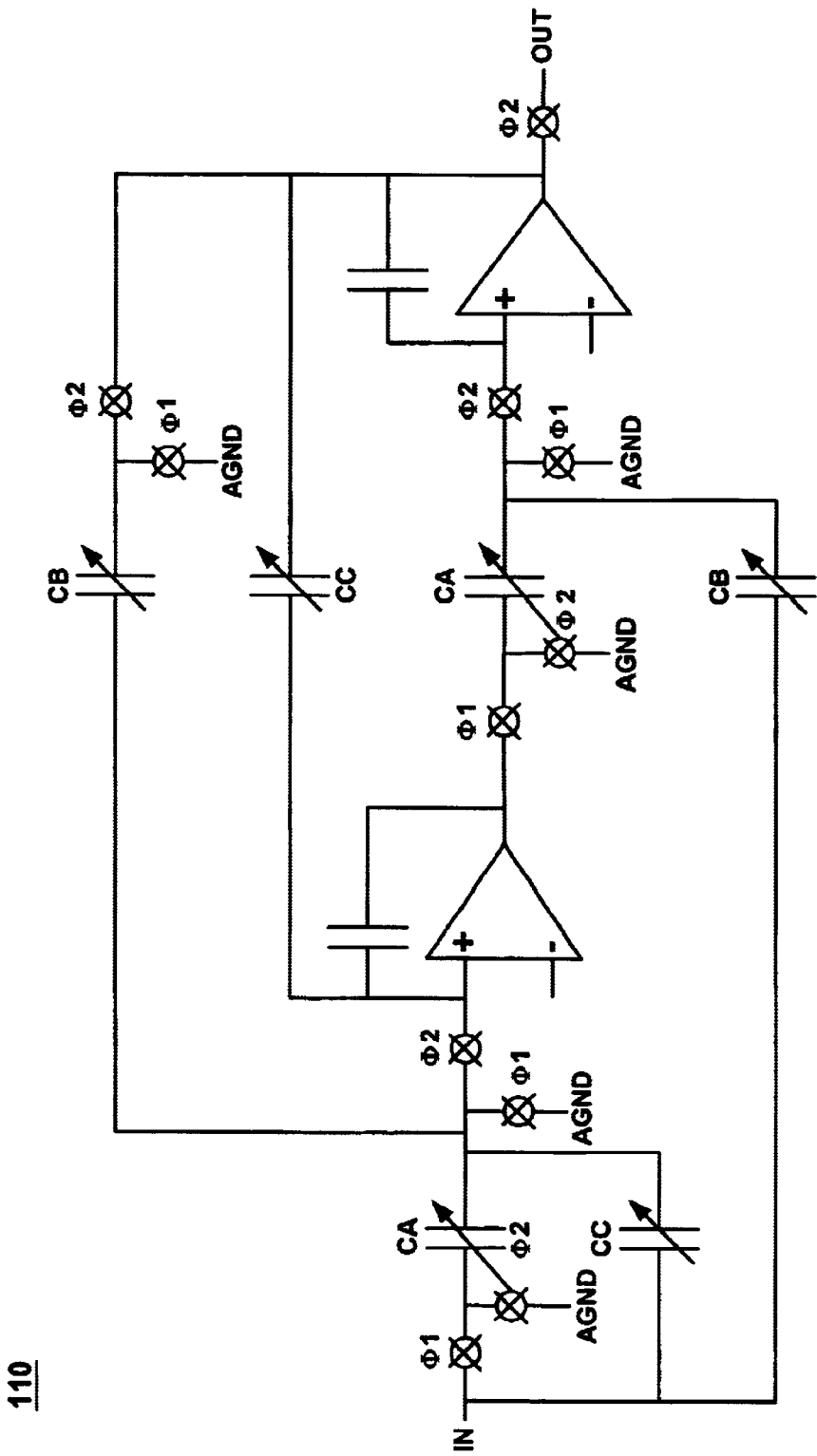
FIG. 14B is a schematic diagram showing one embodiment of a switched capacitor biquad in accordance with the present invention.

FIGS. 14A and 14B are diagrams showing one embodiment of a switched capacitor biquad 110 in accordance with the present invention. FIG. 14A shows the basic interconnection between a type A switched capacitor block 90 and a type B switched capacitor block 100. FIG. 14B is a schematic of a switched capacitor biquad 110 resulting from the interconnection of switched capacitor block 90 and switched capacitor block 100.

Figure 15:
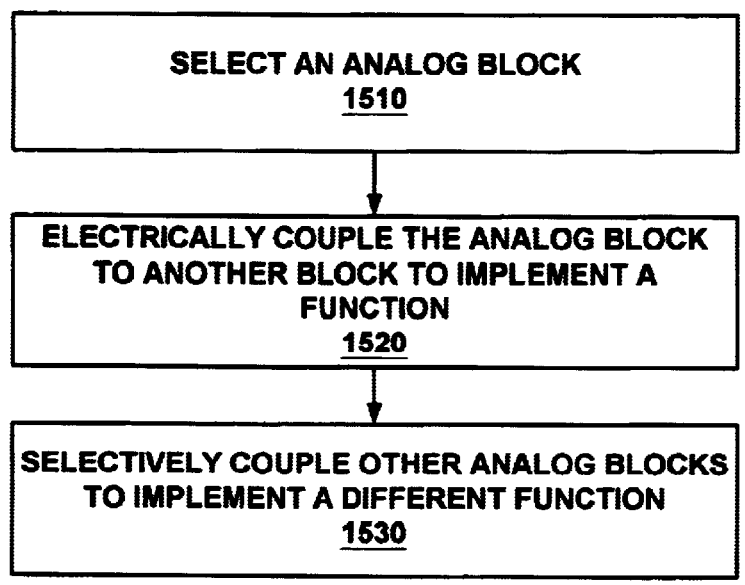
FIG. 15 is a flowchart of the steps in a process for implementing multiple functions using a single integrated circuit in accordance with one embodiment of the present invention.

FIG. 15 is a flowchart of the steps in a process 1500 for implementing multiple functions using a single integrated circuit (e.g., integrated circuit 10 of FIG. 1) in accordance with one embodiment of the present invention.

As described above, integrated circuit 10 includes a plurality of analog blocks 20 (FIGS. 2 and 3) that can be electrically coupled in different combinations to perform different functions. In step 1510 of FIG. 15, according to the user's programming, an analog block is selected from analog blocks 20.

In step 1520, the selected analog block is selectively and electrically coupled to one or more of the other analog blocks 20, depending on the particular analog function to be implemented and according to the user's programming. Certain analog blocks may be bypassed (not used) in the resultant circuit. Characteristics of elements in the analog blocks 20 can also be specified according to the user's programming, also depending on the particular analog function to be implemented.

In step 1530, the analog blocks 20 are reconfigured to perform a different analog function (e.g., a different combination of the analog blocks 20 can be selectively and electrically coupled to perform another function).

In summary, the present invention provides an analog system architecture, and a method thereof, that introduce a single chip solution that contains a set of tailored analog blocks and elements that can be dynamically configured and reconfigured in different ways to implement a variety of different analog functions. The present invention thus provides a programmable analog system architecture that is suited for a variety of applications and therefore can reduce development time and expenses. The present invention facilitates the design of customized chips (integrated circuits and microcontrollers) at reduced costs. As a single chip that can be produced in quantities and customized for a variety of functions and applications, designers are not subjected to the volume requirements needed to make contemporary designs viable. To further reduce development time and expenses, pre-designed combinations of analog blocks ("user modules") can be provided to designers.

The preferred embodiment of the present invention, a programmable analog system architecture, is thus described. While the present invention has been described in particular embodiments, it should be appreciated that the present invention should not be construed as limited by such embodiments, but rather construed according to the following claims.

What is claimed is:

1. A multi-functional device comprising:
  a bus;
  a random access memory (RAM) coupled to said bus;
  a central processing unit (CPU) coupled to said bus; and
  a plurality of analog blocks coupled to said bus, wherein said bus, RAM, CPU and analog blocks reside on a single chip;
  said plurality of analog blocks comprising a first set of analog blocks that is selectively and electrically couplable to and decouplable from another analog block in said plurality of analog blocks;
  wherein said analog blocks are selectively and electrically coupled to implement a particular analog function, wherein different analog functions are implemented by electrically coupling different combinations of said analog blocks.

2. The multi-functional device of claim 1 wherein said first set of analog blocks comprises switched capacitor blocks.

3. The multi-functional device of claim 1 wherein said first set of analog blocks comprises a first type and a second type, wherein said first type is adapted to receive a first set of inputs and wherein said second type is adapted to receive a second set of inputs different from said first set of inputs.

4. The multi-functional device of claim 1 wherein said plurality of analog blocks also comprises a second set of analog blocks, wherein said second set of analog blocks comprises continuous time blocks.

5. The multi-functional device of claim 1 wherein said plurality of analog blocks is arranged in an array having multiple columns and multiple rows.

6. The multi-functional device of claim 5 wherein said array comprises a first row of continuous time blocks and multiple rows of switched capacitor blocks, wherein said first row is disposed between a row of switched capacitor blocks and an edge of said array.

7. The multi-functional device of claim 5 wherein each analog block in a column is coupled to a respective digital bus.

8. The multi-functional device of claim 1 wherein an analog block comprises a plurality of analog elements having changeable characteristics, wherein a characteristic of an analog element is specified according to said particular analog function.

9. A method for implementing multiple functions in a device, said method comprising:
  selecting a first analog block from a plurality of analog blocks coupled to a bus, a random access memory and a central processing unit on a single chip, wherein said first analog block is electrically couplable to and decouplable from another analog block; and coupling electrically said first analog block to another analog block to implement a first analog function;

wherein different analog functions are implemented by selectively and electrically coupling different combinations of analog blocks.

10. The method of claim 9 wherein said first analog block is a switched capacitor block.

11. The method of claim 9 wherein said plurality of analog blocks comprises a plurality of switched capacitor blocks of a first type and a second type, wherein said first type is adapted to receive a first set of inputs and wherein said second type is adapted to receive a second set of inputs different from said first set.

12. The method of claim 9 wherein said plurality of analog blocks comprises a plurality of continuous time blocks.

13. The method of claim 9 wherein said analog blocks are arranged in an array having multiple columns and multiple rows.

14. The method of claim 13 wherein said array comprises a first row of continuous time blocks and multiple rows of switched capacitor blocks, wherein said first row is disposed between a row of switched capacitor blocks and an edge of said array.

15. The method of claim 13 wherein each analog block in a column is coupled to a respective digital bus.

16. The method of claim 9 comprising:

changing a characteristic of an analog element of said first analog block, wherein said characteristic is specified according to which analog function is being implemented.

17. An array of analog blocks comprising:

a first plurality of analog blocks comprising continuous time blocks; and a second plurality of analog blocks comprising switched capacitor blocks, said second plurality of analog blocks coupled to said first plurality of analog blocks, wherein a switched capacitor block is selectively and electrically couplable to and decouplable from another analog block;

wherein said first plurality and said second plurality of analog blocks are selectively and electrically coupled in different combinations to implement different analog functions, and wherein said first plurality and second plurality of analog blocks are coupled to a bus, a random access memory and a central processing unit on a single chip.

18. The array of analog blocks of claim 17 wherein said switched capacitor blocks comprise a first type and a second type, wherein said first type is adapted to receive a first set of inputs and wherein said second type is adapted to receive a second set of inputs different from said first set.

19. The array of analog blocks of claim 17 wherein said array comprises a first row of continuous time blocks and multiple rows of switched capacitor blocks, wherein said first row is disposed between a row of switched capacitor blocks and an edge of said array.

20. The array of analog blocks of claim 19 wherein each analog block in a column is coupled to a respective digital bus.

21. The array of analog blocks of claim 17 wherein an analog function is an amplifier function, a digital-to-analog converter function, an analog-to-digital converter function, an analog driver function, a low band pass filter function, or a high band pass filter function.

22. The array of analog blocks of claim 17 wherein an analog block comprises a plurality of analog elements having changeable characteristics, wherein a characteristic of an analog element is specified according to said particular analog function.

* * * * *